(12) United States Patent
Lee et al.

(10) Patent No.: US 10,873,051 B2
(45) Date of Patent: *Dec. 22, 2020

(54) DISPLAY DEVICE

(71) Applicant: LG Display Co., Ltd., Seoul (KR)

(72) Inventors: Jeonghoon Lee, Seoul (KR); JaeWon Lee, Seoul (KR); Sungjin Kim, Seoul (KR); Jaehyung Jang, Seoul (KR); Hyangmyoung Gwon, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/666,863

(22) Filed: Oct. 29, 2019

(65) Prior Publication Data

US 2020/0067010 A1    Feb. 27, 2020

Related U.S. Application Data

(63) Continuation of application No. 16/038,055, filed on Jul. 17, 2018, now Pat. No. 10,497,896.

(30) Foreign Application Priority Data

Jul. 18, 2017    (KR) .................. 10-2017-0091017

(51) Int. Cl.
*G06F 3/041*    (2006.01)
*H01L 51/52*    (2006.01)
(Continued)

(52) U.S. Cl.
CPC ............ *H01L 51/524* (2013.01); *G06F 3/044* (2013.01); *G06F 3/0412* (2013.01);
(Continued)

(58) Field of Classification Search
CPC ..... G06F 3/0412; G06F 3/044; H01L 51/524; H01L 51/5246; H01L 51/5253; H01L 27/323; H01L 27/3276; H01L 27/3279
See application file for complete search history.

(56) References Cited

U.S. PATENT DOCUMENTS

| 2016/0307971 | A1 | 10/2016 | Jeon |
| 2018/0059862 | A1* | 3/2018 | Zeng ..................... G06F 3/0412 |
| 2018/0226454 | A1 | 8/2018 | Liu et al. |

FOREIGN PATENT DOCUMENTS

| CN | 106775173 A | 5/2017 |
| CN | 106951125 A | 7/2017 |
| JP | 2018-128835 A | 8/2018 |

* cited by examiner

*Primary Examiner* — Lisa S Landis
(74) *Attorney, Agent, or Firm* — Seed IP Law Group LLP

(57) ABSTRACT

Disclosed is a display device which facilitates to prevent a remaining film for a process of forming a metal pattern, wherein the display device may include a substrate including a display area having pixels, and a non-display area having pads to surround the display area, a dam between the display area and the pads, an encapsulation film for covering the dam and the pixels in the display area, a first metal pattern disposed in the non-display area and patterned on the encapsulation film, an insulating layer provided on the first metal pattern, and a second metal pattern disposed in the non-display area and patterned on the insulating layer, wherein the first metal pattern is not provided in a dam area with the dam, and the second metal pattern is provided on the dam area while being in contact with the first metal pattern via a contact hole penetrating through the insulating layer.

22 Claims, 13 Drawing Sheets

(51) Int. Cl.
*H01L 27/32* (2006.01)
*G06F 3/044* (2006.01)
(52) U.S. Cl.
CPC ........ *H01L 27/323* (2013.01); *H01L 27/3276* (2013.01); *H01L 27/3279* (2013.01); *H01L 51/5246* (2013.01); *H01L 51/5253* (2013.01); *G06F 2203/04111* (2013.01)

DISPLAY DEVICE

CROSS REFERENCE TO RELATED APPLICATIONS

This application is a continuation of U.S. patent application Ser. No. 16/038,055, filed Jul. 17, 2018, which claims the benefit of the Korean Patent Application No. 10-2017-0091017 filed on Jul. 18, 2017, which is hereby incorporated by reference as if fully set forth herein.

BACKGROUND

Technical Field

Embodiments of the present disclosure relate to a display device.

Description of the Related Art

With the advancement of an information-oriented society, requirements for a display device of displaying an image are increasing. For example, various display devices such as liquid crystal display (LCD), plasma display panel (PD) and organic light emitting display (OLED) have been utilized.

Especially, the organic light emitting display is a self light emitting display device, and may be fabricated at a light-weight and slim size as it does not need a separate light source unlike a liquid crystal display. In comparison to the liquid crystal display, the organic light emitting display has wider viewing angle and greater contrast ratio. Also, the organic light emitting display is favorable in view of power consumption, is capable of being driven by a direct-current low voltage, and also is excellent for a response speed.

The organic light emitting display includes an organic light emitting device in each pixel. This organic light emitting device may be easily deteriorated by external moisture or oxygen. In order to prevent the deterioration of the organic light emitting device, an encapsulation film is provided to prevent external moisture or oxygen from being permeated into the inside of the organic light emitting device.

The encapsulation film may include at least one inorganic film and at least one organic film, to thereby prevent moisture or oxygen from being permeated into an organic light emitting layer and an electrode. In this case, the at least one organic film may be formed of polymer, which may be obtained by coating a substrate with liquid-type polymer and curing the liquid-type polymer coated onto the substrate. The organic film has fluidity until before the curing process. Thus, the organic film having fluidity may flow out into an area to be provided with the encapsulation film. In order to overcome this problem, a dam for preventing the flow of organic film may be formed in the periphery of the organic light emitting device.

If providing the dam, the dam may cause a step difference in the organic light emitting display. That is, the organic light emitting display may have an uneven surface due to the dam. In this case, if another layer is deposited on the dam, it may cause the following problems.

If metal patterns are formed on the dam by a process using a photoresist pattern, the metal patterns may remain in a corresponding area from which the metal patterns have to be completely removed, which may cause a problem of the remaining film.

BRIEF SUMMARY

Accordingly, embodiments of the present disclosure are directed to a display device that substantially obviates one or more problems due to limitations and disadvantages of the related art, and a display apparatus comprising the same.

An aspect of embodiments of the present disclosure provides a display device which facilitates to prevent a remaining film for a process of forming a metal pattern.

Additional advantages and features of embodiments of the disclosure will be set forth in part in the description which follows and in part will become apparent to those having ordinary skill in the art upon examination of the following or may be learned from practice of embodiments of the disclosure. The objectives and other advantages of embodiments of the disclosure may be realized and attained by the structure particularly pointed out in the written description and claims hereof as well as the appended drawings.

In accordance with embodiments of the disclosure, as embodied and broadly described herein, there is provided a display device that may include a substrate including a display area provided with pixels, and a non-display area configured to surround the display area and provided with pads, a dam disposed between the display area and the pads, an encapsulation film for covering the pixels disposed in the display area, and the dam, a first metal pattern disposed in the non-display area and patterned on the encapsulation film, an insulating layer provided on the first metal pattern, and a second metal pattern disposed in the non-display area and patterned on the insulating layer, wherein the first metal pattern is not provided in a dam area with the dam, and the second metal pattern is provided on the dam area while being in contact with the first metal pattern via a contact hole penetrating through the insulating layer.

It is to be understood that both the foregoing general description and the following detailed description of embodiments of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of embodiments of the disclosure and are incorporated in and constitute a part of this application, illustrate embodiment(s) of the disclosure and together with the description serve to explain the principle of embodiments of the disclosure. In the drawings.

DETAILED DESCRIPTION

Figure 1:
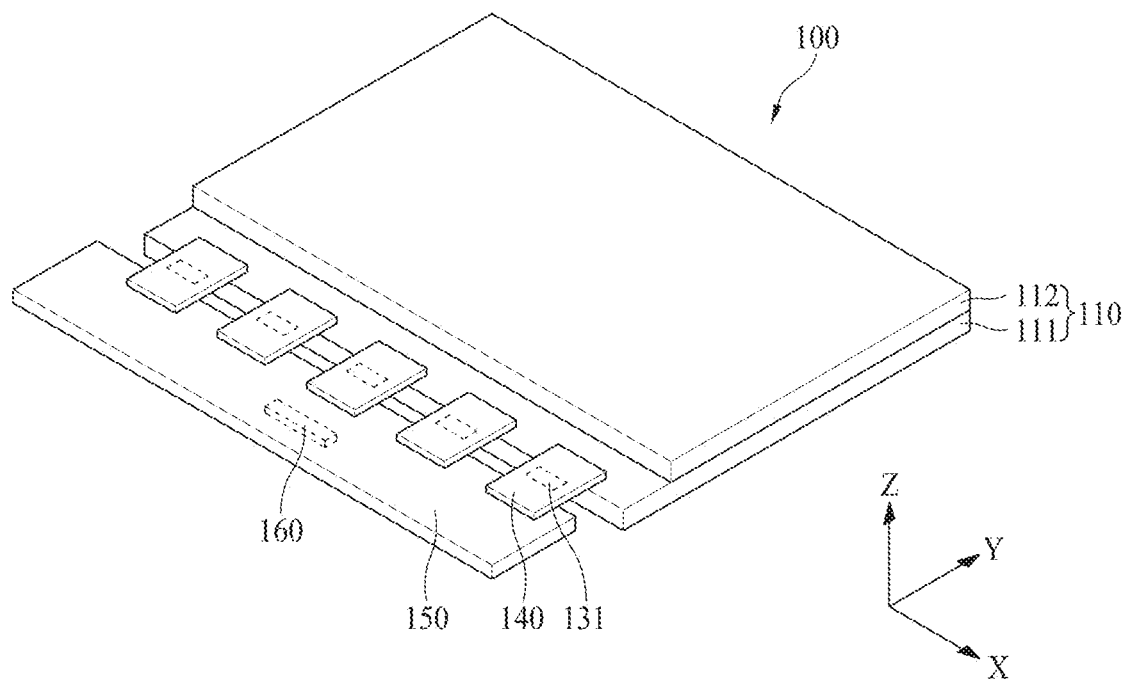
FIG. 1 is a perspective view illustrating a display device according to one embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present disclosure are used, another part may be added unless 'only~' is used. The terms of a singular form may include plural forms unless referred to the contrary.

In construing an element, the element is construed as including an error region although there is no explicit description.

In describing a position relationship, for example, when the positional order is described as 'on~', 'above~', 'below~', and 'next~', a case which is not contact may be included unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Also, "X-axis direction", "Y-axis direction", and "Z-axis direction" are not limited to a perpendicular geometric configuration. That is, "X-axis direction", "Y-axis direction", and "Z-axis direction" may include an applicable wide range of a functional configuration.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a display device according to the embodiment of the present disclosure will be described in detail with reference to the accompanying drawings.

Figure 2:
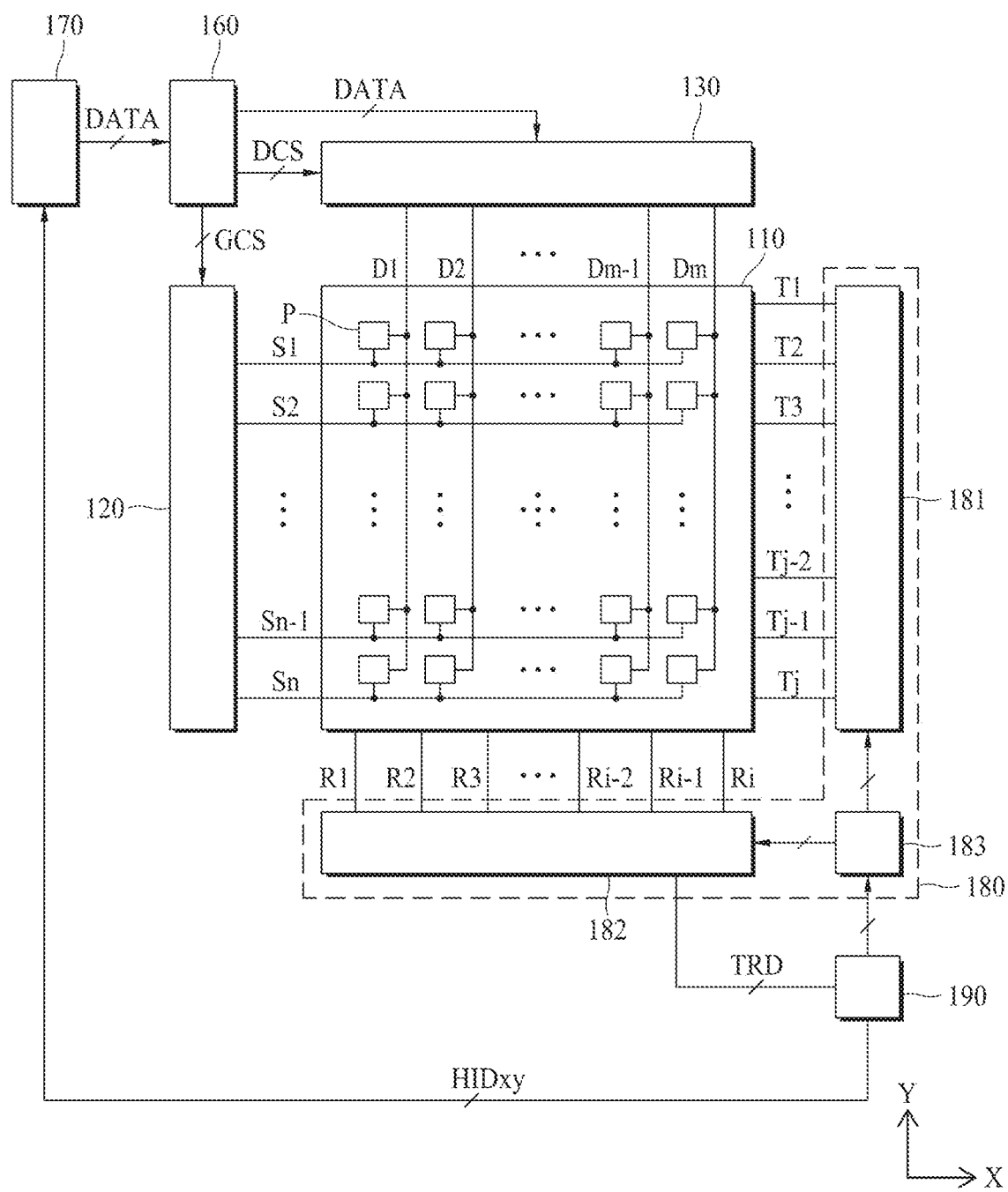
FIG. 2 is a block diagram illustrating the display device according to one embodiment of the present disclosure.

FIG. 1 is a perspective view illustrating a display device according to one embodiment of the present disclosure. FIG. 2 is a block diagram illustrating the display device according to one embodiment of the present disclosure.

Referring to FIGS. 1 and 2, the display device according to one embodiment of the present disclosure may include a display panel 110, a scan driver 120, a data driver 130, a timing controller 160, a host system 170, a touch driver 180, and a touch coordinates calculator 190.

The display device according to the embodiment of the present disclosure may be realized in various flat display devices, for example, liquid crystal display (LCD) device, field emission display (FED) device, plasma display panel (PDP), organic light emitting display (OLED) device, electrophoresis (EPD) device, and etc. Hereinafter, the display device according to the embodiment of the present disclosure is realized in the OLED device, but not limited to this type.

The display panel 110 includes a display area with pixels (P) prepared to display an image. The display panel 110 may include data lines (D1~Dm, 'm' is an integer of 2 or more than 2), and scan lines (S1~Sn, 'n' is an integer of 2 or more than 2). The data lines (D1~Dm) may intersect with the scan lines (S1~Sn). Herein, the pixels (P) may be formed at respective intersection areas defined by the gate and data lines crossing each other.

Each of the pixels (P) of the display panel 110 may be connected with any one of the data lines (D1~Dm) and any one of the scan lines (S1~Sn). Each of the pixels (P) of the display panel 110 may include a driving transistor for controlling a drain-to-source current in accordance to a data voltage supplied to a gate electrode, a scan transistor which is turned-on by a scan signal of the scan line so as to supply the data voltage of the data line to the gate electrode of the driving transistor, an organic light emitting diode which emits light in accordance with the drain-to-source current of the driving transistor, and a capacitor for storing the voltage of the gate electrode of the driving transistor. Thus, each of the pixels (P) may emit light in accordance with a current supplied to the organic light emitting diode.

The scan driver 120 receives a scan control signal (GCS) from the timing controller 160. The scan driver 120 supplies the scan signals to the scan lines (S1~Sn) in accordance with the scan control signal (GCS).

The scan driver 120 may be disposed in a non-display area at one peripheral side or both peripheral sides of the display area of the display panel 110 by a gate driver in panel (GIP) method. In another way, the scan driver 120 may be fabricated in a driving chip, and mounted on a flexible film, wherein the scan driver 120 of the driving chip may be attached to the non-display area at one peripheral side or both peripheral sides of the display area of the display panel 110 by a tape automated bonding (TAB) method.

The data driver 130 receives digital video data (DATA) and data control signal (DCS) from the timing controller 160. The data driver 130 converts the digital video data (DATA) to an analog positive/negative data voltage in accordance with the data control signal (DCS), and supplies the analog positive/negative data voltage to the data lines. That is, the pixels to be supplied with the data voltages are selected by the scan signals of the scan driver 120, and the data voltages are supplied to the selected pixels.

As shown in FIG. 1, the data driver 130 may include a plurality of source drive ICs 131. Each of the plurality of source drive ICs 131 may be mounted on a flexible film 140 by a chip on film (COF) or chip on plastic (COP) method. The flexible film 140 is attached onto pads prepared in the non-display area of the display panel 110 by the use of anisotropic conducting film, whereby the plurality of source drive ICs 131 may be connected with the pads.

A circuit board 150 may be attached to the flexible films 140. A plurality of circuits formed of driving chips may be mounted on the circuit board 150. For example, the timing controller 160 may be mounted on the circuit board 150. The circuit board 150 may be a printed circuit board or a flexible printed circuit board.

The timing controller 160 receives the digital video data (DATA) and timing signals from the host system 170. The timing signals may include a vertical synchronization signal, a horizontal synchronization signal, a data enable signal, a dot clock, and etc. The vertical synchronization signal defines 1 frame period. The horizontal synchronization signal defines 1 horizontal period needed to supply the data voltages to the pixels for 1 horizontal line of the display panel (DIS). The data enable signal defines a period of inputting valid data. The dot clock is a signal which is repeated every preset short time period.

In order to control an operation timing of each of the scan driver 120 and the data driver 130, the timing controller 160 generates a data control signal (DCS) for controlling the operation timing of the data driver 130, and a scan control signal (GCS) for controlling the operation timing of the scan driver 120 on the basis of timing signals. The timing controller 160 outputs the scan control signal (GCS) to the scan driver 120, and outputs the digital video data (DATA) and the data control signal (DCS) to the data driver 130.

The host system 170 may be realized in a navigation system, a set top box, a DVD player, a blu-ray player, a personal computer (PC), a home theater system, a broadcasting receiver, a phone system, and etc. The host system 170 includes a SoC (system on chip) with a scaler, which enables to convert the digital video data (DATA) of input image into a format appropriate for the display on the display panel (DIS). The host system 170 transmits the digital video data (DATA) and timing signals to the timing controller 160.

On the display panel 110, there are first touch electrodes, and second touch electrodes as well as the data lines (D1~Dm) and the scan lines (S1~Sn). The first touch electrodes may intersect with the second touch electrodes. The first touch electrodes may be connected with a first touch driver 181 through first touch lines (T1~Tj, 'j' is an integer of 2 or more than 2). The second touch electrodes may be connected with a second touch driver 182 through second touch lines (R1~Ri, 'i' is an integer of 2 or more than 2).

Touch sensors may be formed at respective intersections of the first touch electrodes and the second touch electrodes. According to the embodiment of the present disclosure, each of the touch sensors according to the embodiment of the present disclosure may be realized by a mutual capacitance, but not limited to this type. The first and second touch electrodes will be described in detail with reference to FIG. 5.

The touch driver 180 supplies a driving pulse to the first touch electrodes through the first touch lines (T1~Tj), and senses the change of charge amount in each of the touch sensors through the second touch lines (R1~Ri). That is, in FIG. 2, the first touch lines (T1~Tj) correspond to Tx lines for supplying the driving pulse, and the second touch lines (R1~Ri) correspond to Rx lines for sensing the change of charge amount in each of the touch sensors.

The touch driver 180 includes the first touch driver 181, the second touch driver 182, and a touch controller 183. The first touch driver 181, the second touch driver 182, and the touch controller 183 may be integrated in one read-out IC (ROIC).

The first touch driver 181 selects the first touch line to be supplied with the driving pulse under control of the touch controller 183, and supplies the driving pulse to the selected first touch line. For example, the first touch driver 181 may supply the driving pulses to the first touch lines (T1~Tj) in sequence.

The second touch driver 182 selects the second touch lines to be received with the change of charge amount in the touch sensors under control of the touch controller 183, and receives the change of charge amount in the touch sensors through the selected second touch lines. For example, the second touch driver 182 may sample the change of charge amount in the touch sensors, which is received through the second touch lines (R1~Ri), and convert the sampled one into touch raw data (TRD) corresponding to digital data.

The touch controller 183 may generate a TX setup signal for setting the first touch line to be supplied with the driving pulse by the first touch driver 181, and an Rx setup signal for setting the second touch line to be received with a touch sensor voltage by the second touch driver 182. Also, the touch controller 183 generates timing signals for controlling an operation timing of each of the first touch driver 181 and the second touch driver 182.

The touch coordinates calculator 190 receives the touch raw data (TRD) from the touch driver 180. The touch coordinates calculator 190 calculates the touch coordinates in accordance with a touch coordinates calculation method, and outputs touch coordinates data (HIDxy) including the touch coordinates information to the host system 170.

The touch coordinates calculator 190 may be realized in a micro controller unit (MCU). The host system 170 analyzes the touch coordinates data (HIDxy) which is provided from the touch coordinates calculator 190, and executes an application program linked with the coordinates of a user's touch based on the analyzed data result. The host system 170 transmits the digital video data (DATA) and timing signals to the timing controller 160 in accordance with the executed application program.

The touch driver 180 may be included in the source drive ICs 131, or may be fabricated in an additional driving chip and mounted on the circuit board 150. Also, the touch coordinates calculator 190 may be fabricated in a driving chip and mounted on the circuit board 150.

Figure 3:
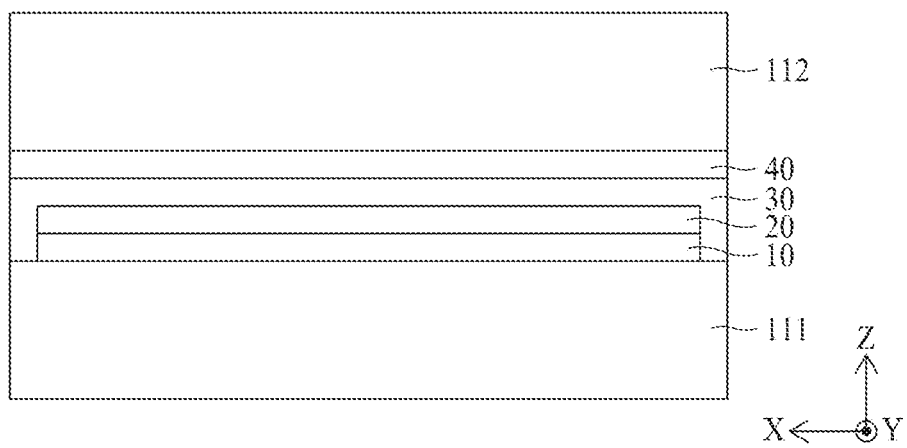
FIG. 3 is a cross sectional view illustrating one lateral side of a display panel shown in FIG. 1.

FIG. 3 is a cross sectional view illustrating one lateral side of the display panel shown in FIG. 1.

Referring to FIG. 3, the display panel 110 may include the first and second substrates 111 and 112, a thin film transistor layer 10 disposed between the first and second substrates 111 and 112, an organic light emitting device layer 20, an encapsulation layer 30, and a touch sensing layer 40.

The first substrate 111 may be a plastic film or a glass substrate.

The thin film transistor layer 10 is formed on the first substrate 111. The thin film transistor layer 10 may include scan lines, data lines, and thin film transistors. Each of the thin film transistors may include a gate electrode, a semiconductor layer, and source and drain electrodes. If the scan driver is formed in a gate driver in panel (GIP) method, the scan driver may be formed together with the thin film transistor layer 10.

The organic light emitting device layer 20 is formed on the thin film transistor layer 10. The organic light emitting device layer 20 may include first electrodes, organic light emitting layers, second electrodes, and banks. Each of the organic light emitting layers may include a hole transporting layer, an organic light emitting layer, and an electron transporting layer. In this case, if a voltage is applied to the first and second electrodes, hole and electron are transferred to the organic light emitting layer through the hole transporting layer and the electron transporting layer, and are then combined in the organic light emitting layer, to thereby emit light. The pixels are prepared in an area for the organic light emitting device layer 20, and the area for the organic light emitting device layer 20 may be defined as a display area, and a peripheral area of the display panel may be defined as the non-display area.

The encapsulation layer 30 is formed on the organic light emitting device layer 20. The encapsulation layer 30 prevents moisture or oxygen from being permeated into the organic light emitting device layer 20. The encapsulation layer 30 may include at least one inorganic film.

The touch sensing layer 40 is formed on the encapsulation layer 30. The touch sensing layer 40 may include first and second touch electrodes so as to sense a user's touch, and bridge electrodes for electrically connecting the first touch electrodes with each other or electrically connecting the second touch electrodes with each other.

Hereinafter, the encapsulation layer 30 and the touch sensing layer 40 according to the first embodiment of the present disclosure will be described in detail with reference to FIGS. 4 to 6.

First Embodiment

Figure 4:
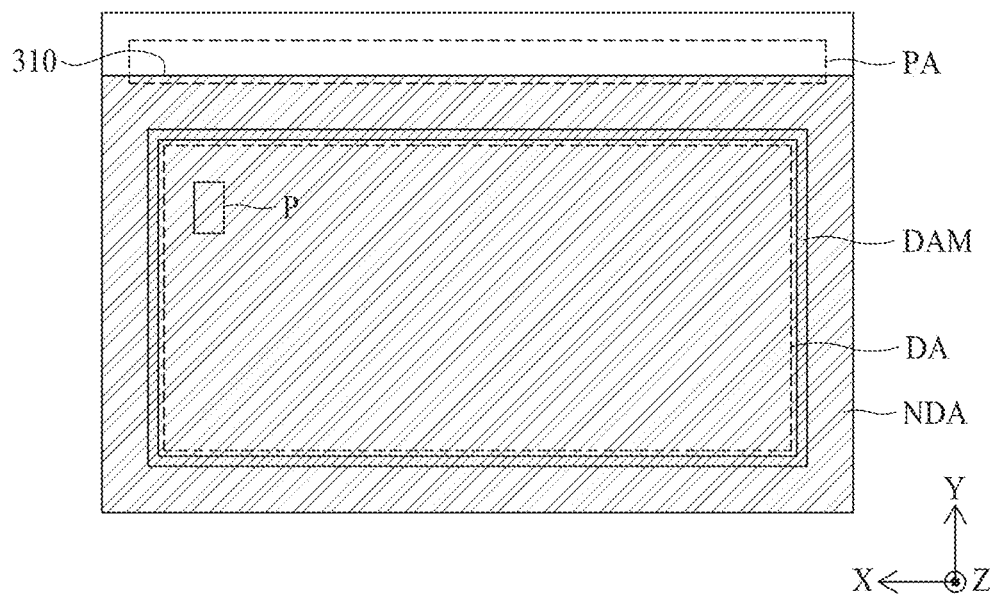
FIG. 4 is a plane view illustrating a first substrate according to one embodiment of the present disclosure.

FIG. 4 is a plane view illustrating a first substrate according to one embodiment of the present disclosure. FIG. 5 is a plane view illustrating one embodiment of a touch sensing layer disposed in the first substrate shown in FIG. 4. FIG. 6 is a cross sectional view illustrating a first embodiment along I-I' of FIG. 5.

Figure 5:
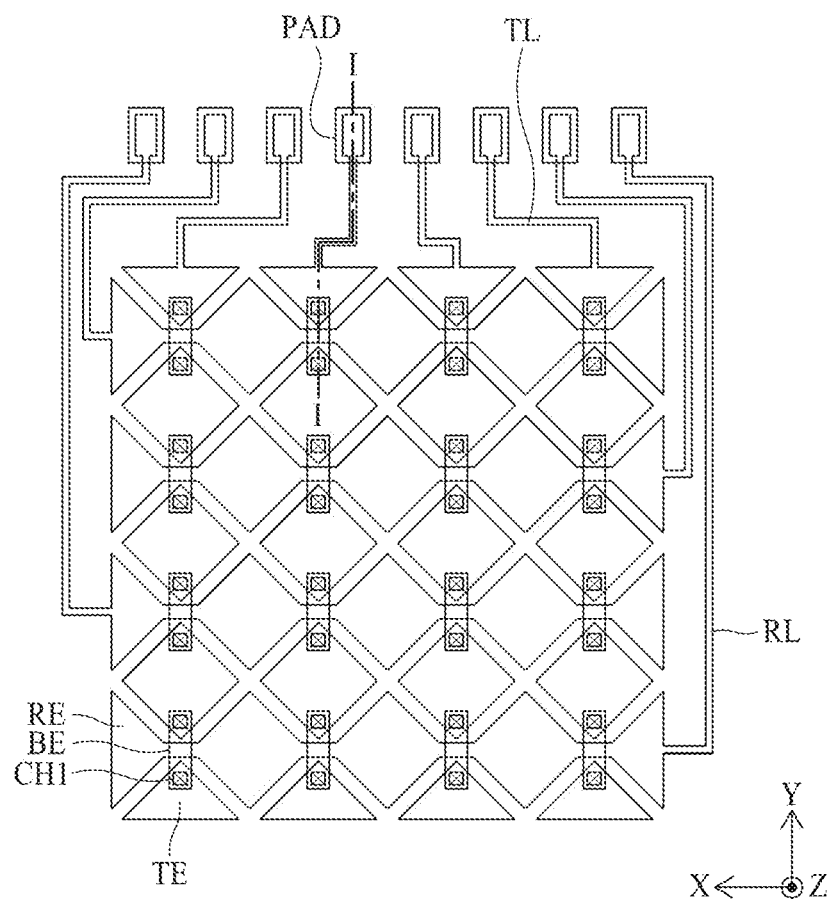
FIG. 5 is a plane view illustrating one embodiment of a touch sensing layer disposed in the first substrate shown in FIG. 4.
Figure 6:
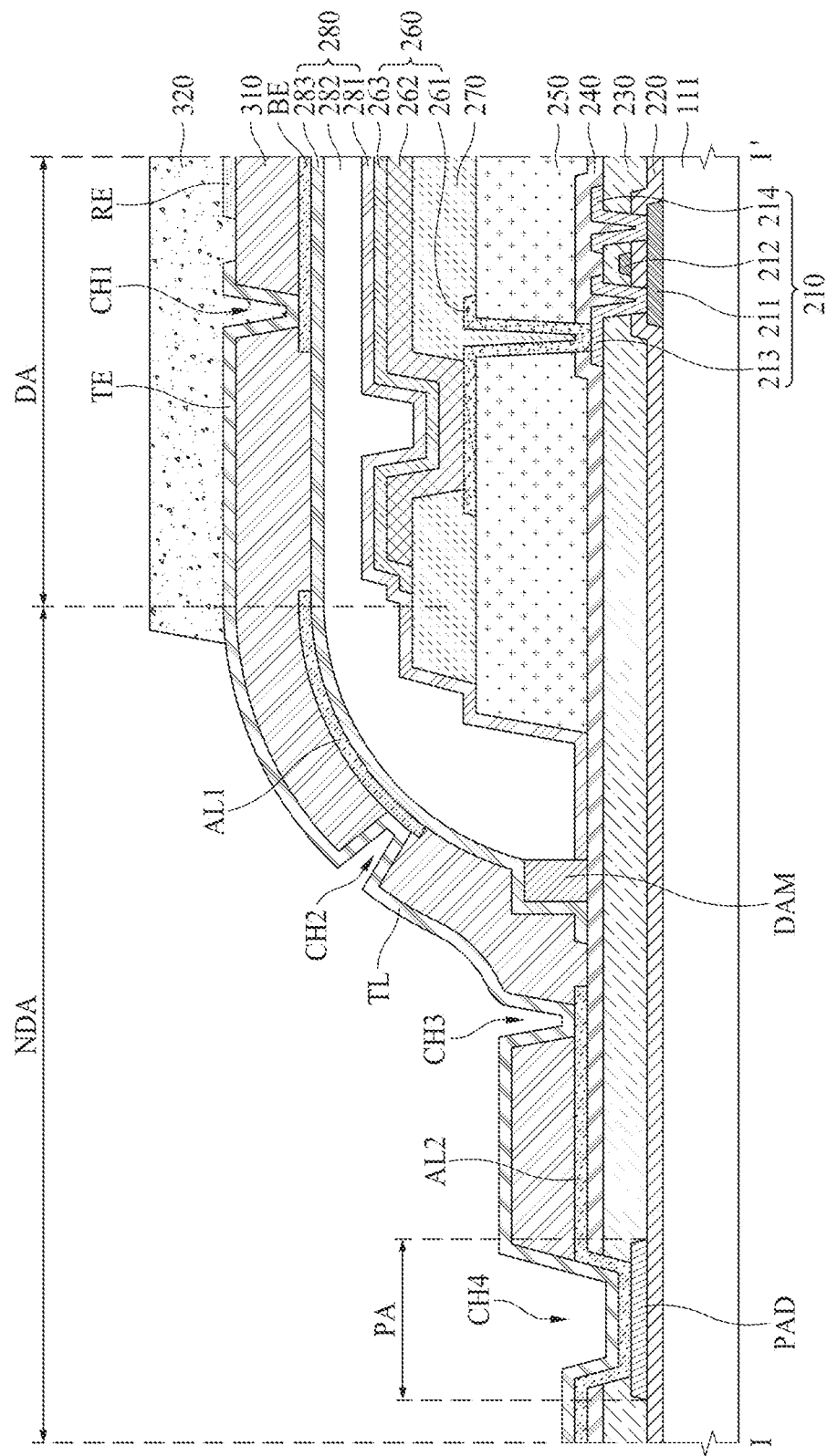
FIG. 6 is a cross sectional view illustrating a first embodiment along I-I' of FIG. 5.

Referring to FIGS. 4 to 6, the first substrate 111 is divided into a display area (DA) and a non-display area (NDA), wherein a pad area (PA) for pads (PAD) and a dam (DAM) may be formed in the non-display area (NDA).

A thin film transistor layer 10 and an organic light emitting device layer 20 may be formed in the display area (DA) of the first substrate 11.

The thin film transistor layer 10 may include thin film transistors 210, a gate insulating film 220, an insulating interlayer 230, a protection layer 240, and a planarization film 250.

A buffer film (not shown) is formed on one surface of the first substrate 111. The buffer film (not shown) is provided on one surface of the first substrate 111 so as to protect the thin film transistors 210 and organic light emitting devices 260 from moisture permeating through the first substrate 111 which is vulnerable to moisture permeability. Herein, one surface of the first substrate 111 may confront a second substrate 112. The buffer film (not shown) may be formed of a plurality of inorganic films alternately deposited. For example, the buffer film (not shown) may be formed in a multi-layered structure by alternately depositing at least one inorganic film from a silicon oxide film (SiOx), a silicon nitride film (SiNx), and silicon oxynitride (SiON). It is possible to omit the buffer film (not shown).

The thin film transistor 210 is provided on the buffer film (not shown). The thin film transistor 210 includes an active layer 211, a gate electrode 212, a source electrode 213, and a drain electrode 214. In FIG. 6, the thin film transistor 210 is provided in a top gate type where the gate electrode 212 is positioned above the active layer 211, but not limited to this type. For example, the thin film transistor 210 may be provided in a bottom gate type where the gate electrode 212 is positioned below the active layer 211, or a double gate type where the gate electrode 212 is positioned both above and below the active layer 211.

The active layer 211 is provided on the buffer film (not shown). The active layer 211 may be formed a silicon-based semiconductor material or an oxide-based semiconductor material. A light shielding layer may be additionally provided between the buffer film and the active layer 211 so as to block ambient light being incident on the active layer 211.

The gate insulating film 220 may be provided on the active layer 211. The gate insulating film 220 may be formed in a single-layered structure of the inorganic insulating material such as silicon oxide (SiOx) or silicon nitride (SiNx), or a multi-layered structure of the above silicon oxide (SiOx) and silicon nitride (SiNx).

The gate electrode 212 and gate line may be provided on the gate insulating film 220. The gate electrode 212 and gate line may be formed in a single-layered structure or multi-layered structure of materials selected among molybdenum (Mo), aluminum (Al), chrome (Cr), aurum (Au), titanium (Ti), nickel (Ni), neodymium (Nd), copper (Cu) and their alloys.

The insulating interlayer 230 may be provided on the gate electrode 212 and gate line. The insulating interlayer 230 may be formed in a single-layered structure of the inorganic insulating material such as silicon oxide (SiOx) or silicon nitride (SiNx), or a multi-layered structure of the above silicon oxide (SiOx) and silicon nitride (SiNx).

The source electrode 213, the drain electrode 214, and data line may be provided on the insulating interlayer 230. Each of the source electrode 214 and the drain electrode 214 may be connected with the active layer 211 via a contact hole penetrating through the gate insulating film 220 and the insulating interlayer 230. The source electrode 213, the drain electrode 214, and the data line may be formed in a single-layered structure or multi-layered structure of materials selected among molybdenum (Mo), aluminum (Al), chrome (Cr), aurum (Au), titanium (Ti), nickel (Ni), neodymium (Nd), copper (Cu) and their alloys.

The protection film 240 for an insulation of the thin film transistor 210 may be provided on the source electrode 213, the drain electrode 214, and the data line. The protection film 240 may be formed in a single-layered structure of an inorganic material such as silicon oxide (SiOx) or silicon nitride (SiNx), or a multi-layered structure of the above silicon oxide (SiOx) and silicon nitride (SiNx).

The planarization film 250 may be provided on the protection film 240 so as to planarize a step difference area caused by the thin film transistor 210. The planarization film 250 may be formed of an organic material, for example, acryl resin, epoxy resin, phenolic resin, polyamide resin, polyimide resin, and etc.

An organic light emitting device layer 20 (FIG. 3) is formed on the thin film transistor layer 10 (FIG. 3), wherein the organic light emitting device layer 20 includes the organic light emitting devices 260 and bank 270.

The organic light emitting devices 260 and bank 270 are provided on the planarization film 250. The organic light emitting device 260 may include a first electrode 261, an organic light emitting layer 262, and a second electrode 263. The first electrode 261 may be an anode electrode, and the second electrode 263 may be a cathode electrode.

The first electrode 261 may be provided on the planarization film 250. The first electrode 261 may be connected with the source electrode 213 of the thin film transistor 210 via a contact hole penetrating through the protection film 240 and the planarization film 250. The first electrode 261 may be formed of a metal material with high reflectance, and more particularly, a deposition structure of aluminum and titanium (Ti/Al/Ti), a deposition structure of aluminum and Indium Tin Oxide (ITO/AL/ITO), an APC alloy, and a deposition structure of APC alloy and Indium Tin Oxide (ITO/APC/ITO). Herein, the APC alloy is an alloy of argentums (Ag), palladium (Pd), and copper (Cu).

The bank 270 is provided to cover the edge of the first electrode 261 on the planarization film 250, to thereby divide the pixels (P). That is, the bank 270 functions as a pixel defining film so as to define the pixels (P). The bank 270 may be formed of an organic material, for example, acryl resin, epoxy resin, phenolic resin, polyamide resin, polyimide resin, and etc.

The organic light emitting layer 262 is provided on the first electrode 261 and the bank 270. The organic light emitting layer 262 may have a hole transporting layer, at least one light emitting layer, and an electron transporting layer. In this case, if a voltage is applied to the first electrode 261 and the second electrode 263, hole and electron are transferred to the light emitting layer through the hole transporting layer and the electron transporting layer, and are then combined in the light emitting layer, to thereby emit light.

The organic light emitting layer 262 may be a white light emitting layer for emitting white light. In this case, the organic light emitting layer 262 may be provided to cover the first electrode 261 and the bank 270. In this case, a color filter (not shown) may be provided on the second substrate 112.

The organic light emitting layer 262 may include a red emission layer for emitting red light, a green emission layer for emitting green light, or a blue emission layer for emitting blue light. In this case, the organic light emitting layer 262 may be provided in the area corresponding to the first electrode 261, and a color filter may not be provided on the second substrate 112.

The second electrode 263 is formed on the organic light emitting layer 262. If the organic light emitting display device is formed in a top emission structure, the second electrode 263 may be formed of a transparent metal material (transparent conductive material, TCO) capable of transmitting light therethrough, for example, Indium Tin Oxide (ITO) or Indium Zinc Oxide (IZO), or may be formed of a semi-transmissive conductive material such as magnesium (Mg), argentums (Ag), or an alloy of magnesium (Mg) and argentums (Ag). A capping layer may be provided on the second electrode 263.

The encapsulation layer 30 (FIG. 3) is formed on the organic light emitting device layer 20, wherein the encapsulation layer 30 is provided not only in the display area (DA) but also in the non-display area (NDA). The encapsulation layer 30 includes an encapsulation film 280 and a dam (DAM).

The encapsulation film 280 may prevent a permeation of oxygen or moisture into the organic light emitting layer 262 and the second electrode 263. To this end, the encapsulation film 280 may include at least one inorganic film and at least one organic film. Also, the encapsulation film 280 may include a first inorganic film 281, an organic film 282, and a second inorganic film 283.

The first inorganic film 281 may be disposed on the second electrode 263. The first inorganic film 281 may cover the second electrode 263. The organic film 282 may be disposed on the first inorganic film 281. The organic film 282 may be formed at a thickness enough to prevent particles from getting into the organic light emitting layer 262 and the second electrode 263 through the first inorganic film 281. The second inorganic film 283 may be disposed on the organic film 282. The second inorganic film 283 may cover the organic film 282.

Each of the first and second inorganic films 281 and 283 may be formed of silicon nitride, aluminum nitride, zirconium nitride, titanium nitride, hafnium nitride, tantalum nitride, silicon oxide, aluminum oxide, or titanium oxide. The organic film 282 may be formed of acryl resin, epoxy resin, phenolic resin, polyamide resin, polyimide resin, and etc.

The dam (DAM) is disposed in the non-display area (NDA) so as to prevent the flow of the organic film 282 for the encapsulation film 280. In more detail, the dam (DAM) is provided to surround the peripheral area of the display area (DA) so that it is possible to prevent the flow of the organic film 282 for the encapsulation film 280. Also, the dam (DAM) is disposed between the display area (DA) and the pad area (PA) so as to prevent the flow of the organic film 282, that is, to prevent the organic film 282 for the encapsulation film 280 from being permeated into the pad area (PA). Accordingly, the dam (DAM) prevents the organic film 282 from being exposed to the external of the display device, or prevents the organic film 282 from being permeated into the pad area (PA).

The dam (DAM) may be manufactured together with the bank 270 or the planarization film 250 of the pixel (P), and the dam (DAM) may be formed of the same material as that of the planarization film 250 or the bank 270. In this case, the dam (DAM) may be formed of an organic material such as acryl resin, epoxy resin, phenolic resin, polyamide resin, or polyimide resin.

As shown in FIG. 6, in an embodiment, the dam structure DAM includes two opposite sidewalls DS1, DS2. The sidewall DS1 is adjacent to the display area DA and the sidewall DS2 is adjacent to the connection pad PAD. The sidewall DS1 abuts or is adjacent to the organic film 282. The inorganic film 283 extends over an upper surface of the dam structure DAM and is adjacent to the sidewall DS2 of the dam structure. So essentially, the inorganic film 283 and the dame structure DAM together encapsulate the organic film 282 and prevent the organic film 282 from extending beyond the dam structure DAM further toward the non-display area, or specifically, toward the connect pad PAD.

The dam structure DAM abuts the inorganic film 281 and a lower surface of the dam structure is substantially coplanar with an portion of the inorganic film 281 that is adjacent to the dam structure DAM.

FIG. 6 shows that the dam (DAM) is not covered by the first inorganic film 281, but not limited to this structure. If the display area (DA) is covered by the first inorganic film 281, the first inorganic film 281 may cover the dam (DAM).

A touch sensing layer 40 is provided on the encapsulation layer 30. The touch sensing layer 40 may include first touch electrodes (TE), second touch electrodes (RE), bridge electrodes (BE), a first metal pattern, a second metal pattern, an insulating layer 310, and a passivation film 320.

A buffer layer (not show) is formed on the encapsulation layer 30. The buffer layer (not shown) is formed to expose the pad (PAD) in the display area (DA) and the non-display area (NDA). The buffer layer (not shown) is provided to cover the dam (DAM). It is possible to omit the buffer layer (not shown).

The bridge electrodes (BE) and the first metal pattern are formed on the buffer layer. The bridge electrodes (BE) are formed in the display area (DA) and are provided to electrically connect the first touch electrodes (TE), which are formed on the insulating layer 310, with each other. In order to prevent a disconnection between the first touch electrodes (TE) and the second touch electrodes (RE) at their intersections, the first touch electrodes (TE) which are adjacent to each other in a first direction (Y-axis direction) may be electrically connected by the use of bridge electrodes (BE). The bridge electrode (BE) may be disposed in the different layer from those of the first and second touch electrodes (TE, RE), and the bridge electrode (BE) may be connected with the adjacent first touch electrodes (TE) via first contact holes (CH1). The bridge electrode (BE) may intersect with the second touch electrode (RE).

In this case, the first contact holes (CH1) may penetrate through the insulating layer 310. As the bridge electrode (BE) is disposed below the insulating layer 310, the bridge electrode (BE) is exposed by the two of first contact holes (CH1). Also, the bridge electrode (BE) is in contact with the two of adjacent first touch electrodes (TE).

The first metal pattern is formed in the non-display area (NDA), and is disposed in the same layer as those of the bridge electrodes (BE). The first metal pattern is provided at a predetermined interval from the bridge electrode (BE) disposed at one end among the plurality of bridge electrodes (BE). The first metal pattern is not provided in a dam area. Accordingly, as the dam area is provided with the dam (DAM), there is a step difference caused by the dam (DAM). For a process of manufacturing the first metal pattern, a remaining film may be generated due to the step difference caused by the dam (DAM). Accordingly, the metal patterns, which have to be electrically insulated from each other, may be connected with each other. In order to prevent this problem, the first metal pattern is not provided in the dam area of the display device according to the present disclosure.

The first metal pattern may be an auxiliary line (AL) which is connected with the first touch line (TL) or second touch line (RL) so as to reduce a resistance of the first touch line (RL) or second touch line (RL). The auxiliary line (AL) may include a first auxiliary line (AL1) provided between the display area (DA) and the dam area provided with the dam (DAM). Also, the auxiliary line (AL) may include a second auxiliary line (AL2) provided between the dam area and the pad area (PA) and also patterned in the pad area (PA). As the second auxiliary line (AL2) is in contact with the pad (PAD) in the pad area (PA), the second auxiliary line (AL2) may be connected with a first touch driver 181 (FIG. 2) or second touch driver 182 (FIG. 2) via the pad (PAD). Meanwhile, the first auxiliary line (AL1) and the second auxiliary line (AL2) are provided with the dam area interposed-in between, whereby the first auxiliary line (AL1) is physically separated from the second auxiliary line (AL2).

The insulating layer 310 is formed on the bridge electrodes (BE) and the first metal pattern. Accordingly, as the insulating layer 310 is disposed on the bridge electrodes (BE), it is possible to insulate the bridge electrodes (BE) from the second touch electrodes (RE). The insulating layer 310 is disposed between the bridge electrodes (BE) so that it is possible to insulate the bridge electrodes (BE) from each other.

The insulating layer 310 is formed in the non-display area (NDA) as well as the display area (DA). Especially, the insulating layer 310 is provided to cover the dam area so that it is possible to reduce the step difference caused by the dam (DAM). The insulating layer 310 has a thickness which is enough to prevent the remaining film caused by the step difference for a process of manufacturing the second metal pattern. The insulating layer 310 has a thickness which is greater than ½ (the half) of the height of the dam (DAM), preferably.

The first touch electrodes (TE), the second touch electrode (RE) and the second metal pattern are formed on the insulating layer 310. The first touch electrodes (TE) and the second touch electrodes (RE) are formed in the display area (DA). The first touch electrodes (TE) are disposed in a first direction (Y-axis direction), and are connected with each other. The second touch electrodes (RE) are disposed in a second direction (X-axis direction), and are connected with each other. The first direction (Y-axis direction) may be parallel to scan lines (S1~Sn) and the second direction (X-axis direction) may be parallel to data lines (D1~Dm), or the first direction (Y-axis direction) may be parallel to the data lines (D1~Dm) and the second direction (X-axis direction) may be parallel to the scan lines (S1~Sn).

Each of the first touch electrodes (TE) connected in the first direction (Y-axis direction) is electrically insulated from the first touch electrodes (TE) neighboring in the second direction (X-axis direction). Each of the second touch electrodes (RE) connected in the second direction (X-axis direction) is electrically insulated from the second touch electrodes (RE) neighboring in the first direction (Y-axis direction).

Accordingly, a mutual capacitance corresponding to a touch sensor may be formed in the intersection of the first and second touch electrodes (TE, RE).

The second metal pattern is formed in the non-display area (NDA), and is patterned to be overlapped with the first metal pattern. Unlike the first metal pattern, the second metal pattern may be formed in the dam area.

The second metal pattern may be a first touch line (TL) which extends from the first touch electrode (TE) disposed at one end among the plurality of first touch electrodes (TE) connected with each other in the first direction (Y-axis direction) and is also patterned in the pad area (PA). The first touch line (TL) is in contact with the pad (PAD) in the pad area (PA) so that the first touch line (TL) may be connected with the first touch driver 181 via the pad (PAD). Accordingly, the first touch electrodes (TE) connected with each other in the first direction (Y-axis direction), through the bridge electrodes (BE), may receive a driving pulse from the first touch driver 181 (FIG. 2) through the first touch line (TL).

The first touch line (TL) is overlapped with the auxiliary line (AL). The first touch line (TL) may be in contact with the first auxiliary line (AL1) via a second contact hole (CH2). The second contact hole (CH2) may penetrate through the insulating layer 310. The first touch line (TL) may be in contact with the first auxiliary line (AL1) via the second contact hole (CH2) disposed in the insulating layer 310 and configured to expose the first auxiliary line (AL1). Also, the first touch line (TL) may be in contact with the second auxiliary line (AL2) via a third contact hole (CH3). The third contact hole (CH3) may penetrate through the insulating layer 310. The first touch line (TL) may be in contact with the second auxiliary line (AL2) via the third contact hole (CH3) disposed in the insulating layer 310 and configured to expose the second auxiliary line (AL2).

Although not shown in detail, the second metal pattern may be a second touch line (RL) which extends from the second touch electrode (RE) disposed at one end among the plurality of second touch electrodes (RE) connected in the second direction (X-axis direction), and is also patterned in the pad area (PA). The second touch line (RL) is in contact with the pad (PAD) in the pad area (PA) so that the second touch line (RL) may be connected with the second touch driver 182 via the pad (PAD). Accordingly, the second touch driver 182 may receive the charge change amount in the touch sensors of the second touch electrodes (RE) connected with each other in the second direction (X-axis direction).

The second touch line (RL) is overlapped with the auxiliary line (AL). The second touch line (RL) may be in contact with the first auxiliary line (AL1) via the second contact hole (CH2). The second contact hole (CH2) may penetrate through the insulating layer 310. The second touch line (RL) may be in contact with the first auxiliary line (AL1) via the second contact hole (CH2) disposed in the insulating layer 310 and configured to expose the first auxiliary line (AL1). Also, the second touch line (RL) may be in contact with the second auxiliary line (AL2) via the third contact hole (CH3). The third contact hole (CH3) may penetrate through the insulating layer 310. The second touch line (RL) may be in contact with the second auxiliary line (AL2) via the third contact hole (CH3) disposed in the insulating layer 310 and configured to expose the second auxiliary line (AL2).

The passivation film 320 is formed on the insulating film 310, the first touch electrodes (TE) and the second touch electrodes (RE). The passivation film 320 prevents the harmful environments from reaching the features below the passivation film 320 so that it is possible to maintain the characteristic stabilization of the display device.

In the embodiment of the present disclosure, the touch sensing layer 40 (FIG. 2) is directly formed on the encapsulation layer 30, whereby it is unnecessary to carry out an alignment process between the first substrate 111 and the second substrate 112 for a process of bonding the first substrate 111 and the second substrate 112 to each other.

In the present disclosure, as described above, the insulating layer 310 for covering the dam area as well as the display area (DA) is formed at the enough thickness so that it is possible to mitigate the step difference caused by the dam (DAM). Accordingly, it is possible to prevent the remaining film for a process of forming the second metal pattern on the dam (DAM), for example, the first touch line (TL) or second touch line (RL).

In the present disclosure, the auxiliary line (AL) is overlapped with the first touch line (TL) or second touch line (RL), and the first touch line (RL) or second touch line (RL) is in contact with the auxiliary line (AL), to thereby reduce the resistance of first touch line (TL) or second touch line (RL).

In the present disclosure, the auxiliary line (AL) is disposed in the same layer as the bridge electrode (BE), and the auxiliary line (AL) is formed of the same material as that of the bridge electrode (BE). Accordingly, it is possible to form the auxiliary line (AL) without an additional process.

In the present disclosure, the auxiliary line (AL) is not formed in the dam area, and the auxiliary line (AL) is in contact with the first touch line (TL) or second touch line (RL) via the second and third contact holes (CH2, CH3) so that it is possible to prevent the remaining film for the process of forming the auxiliary line (AL).

Second Embodiment

Figure 7:
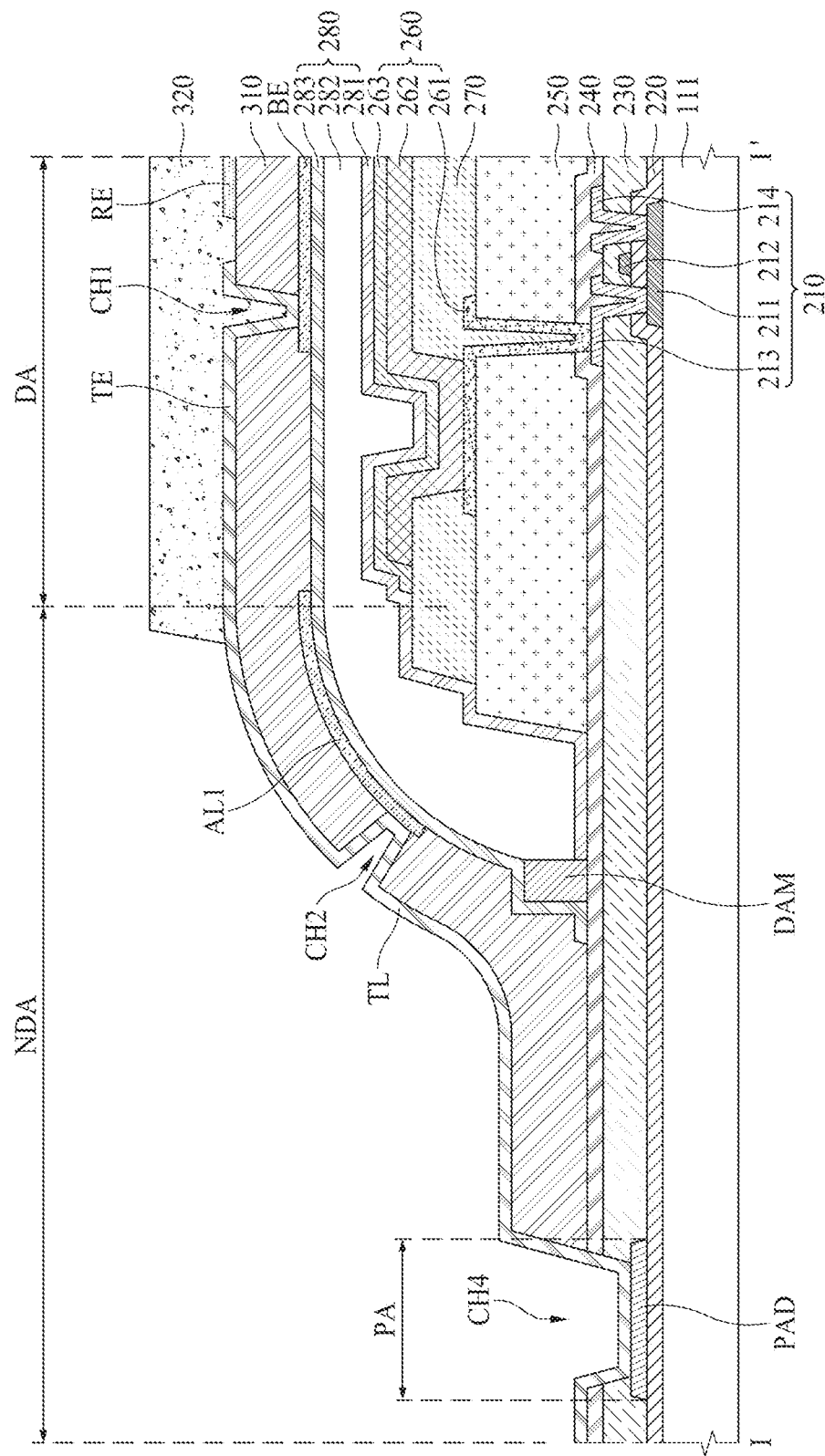
FIG. 7 is a cross sectional view illustrating a second embodiment along I-I' of FIG. 5.

FIG. 7 is a cross sectional view illustrating a second embodiment along I-I' of FIG. 5.

A display device shown in FIG. 7 is different in its auxiliary line (AL) including only first auxiliary line (AL1) from the display device shown in FIG. 6. Hereinafter, a detailed description for the same parts as those of FIG. 6 will be omitted.

Referring to FIG. 7, a first substrate 111 is divided into a display area (DA) and a non-display area (NDA), wherein a pad area (PA) for pads (PAD) and a dam (DAM) may be formed in the non-display area (NDA).

A thin film transistor layer 10 and an organic light emitting device layer 20 may be formed in the display area (DA) of the first substrate 11.

The thin film transistor layer 10 may include thin film transistors 210, a gate insulating film 220, an insulating interlayer 230, a protection layer 240, and a planarization film 250.

An organic light emitting device layer 20 is formed on the thin film transistor layer 10, wherein the organic light emitting device layer 20 includes organic light emitting devices 260 and bank 270.

An encapsulation layer 30 is formed on the organic light emitting device layer 20, wherein the encapsulation layer 30 is provided in the non-display area (NDA) as well as the display area (DA). The encapsulation layer 30 may include an encapsulation film 280 and a dam (DAM).

A touch sensing layer 40 is formed on the encapsulation layer 30. The touch sensing layer 40 may include first touch electrodes (TE), second touch electrodes (RE), bridge electrodes (BE), a first metal pattern, a second metal pattern, an insulating layer 310 and a passivation film 320.

A buffer layer is formed on the encapsulation layer 30. The buffer layer is formed to expose the pad (PAD) in the display area (DA) and the non-display area (NDA). The buffer layer is provided to cover the dam (DAM). It is possible to omit the buffer layer.

The bridge electrodes (BE) and the first metal pattern are formed on the buffer layer. The bridge electrodes (BE) are formed in the display area (DA) and are provided to electrically connect the first touch electrodes (TE), which are formed on the insulating layer 310, with each other. In order to prevent a disconnection between the first touch electrodes (TE) and the second touch electrodes (RE) at their intersections, the first touch electrodes (TE) which are adjacent to each other in a first direction (Y-axis direction) may be electrically connected by the use of bridge electrodes (BE). The bridge electrode (BE) may be disposed in the different layer from those of the first and second touch electrodes (TE, RE), and the bridge electrode (BE) may be connected with the adjacent first touch electrodes (TE) via first contact holes (CH1). The bridge electrode (BE) may intersect with the second touch electrode (RE).

The first metal pattern is formed in the non-display area (NDA), and is disposed in the same layer as those of the bridge electrodes (BE). The first metal pattern is provided at a predetermined interval from the bridge electrode (BE) disposed at one end among the plurality of bridge electrodes (BE). The first metal pattern is not provided in a dam area. Accordingly, as the dam area is provided with the dam (DAM), there is a step difference caused by the dam (DAM). For a process of manufacturing the first metal pattern, a remaining film may be generated due to the step difference caused by the dam (DAM). Accordingly, the metal patterns, which have to be electrically insulated from each other, may be connected with each other. In order to prevent this problem, the first metal pattern is not provided in the dam area of the display device according to the present disclosure.

The first metal pattern may be an auxiliary line (AL) which is connected with the first touch line (TL) or second touch line (RL) so as to reduce a resistance of the first touch line (RL) or second touch line (RL). The auxiliary line (AL) may include a first auxiliary line (AL1) provided between the display area (DA) and the dam area provided with the dam (DAM).

The insulating layer 310 is formed on the bridge electrodes (BE) and the first metal pattern. Accordingly, as the insulating layer 310 is disposed on the bridge electrodes (BE), it is possible to insulate the bridge electrodes (BE) from the second touch electrodes (RE). The insulating layer 310 is disposed between the bridge electrodes (BE) so that it is possible to insulate the bridge electrodes (BE) from each other.

The insulating layer 310 is formed in the non-display area (NDA) as well as the display area (DA). Especially, the insulating layer 310 is provided to cover the dam area so that it is possible to reduce the step difference caused by the dam (DAM). The insulating layer 310 has a thickness which is enough to prevent the remaining film caused by the step difference for a process of manufacturing the second metal pattern. The insulating layer 310 has a thickness which is greater than ½ (the half) of the height of the dam (DAM), preferably.

The first touch electrodes (TE), the second touch electrode (RE) and the second metal pattern are formed on the insulating layer 310. The first touch electrodes (TE) and the second touch electrodes (RE) are formed in the display area (DA). The first touch electrodes (TE) are disposed in a first direction (Y-axis direction), and are connected with each other. The second touch electrodes (RE) are disposed in a second direction (X-axis direction), and are connected with each other. The first direction (Y-axis direction) may be parallel to scan lines (S1~Sn) and the second direction (X-axis direction) may be parallel to data lines (D1~Dm), or the first direction (Y-axis direction) may be parallel to the data lines (D1~Dm) and the second direction (X-axis direction) may be parallel to the scan lines (S1~Sn).

Each of the first touch electrodes (TE) connected in the first direction (Y-axis direction) is electrically insulated from the first touch electrodes (TE) neighboring in the second direction (X-axis direction). Each of the second touch electrodes (RE) connected in the second direction (X-axis direction) is electrically insulated from the second touch electrodes (RE) neighboring in the first direction (Y-axis direction).

Accordingly, a mutual capacitance corresponding to a touch sensor may be formed in the intersection of the first and second touch electrodes (TE, RE).

The second metal pattern is formed in the non-display area (NDA), and is patterned to be overlapped with the first metal pattern.

The second metal pattern may be a first touch line (TL) which extends from the first touch electrode (TE) disposed at on end among the plurality of first touch electrodes (TE) connected with each other in the first direction (Y-axis direction), and is also patterned in the pad area (PA). The first touch line (TL) is in contact with the pad (PAD) in the pad area (PA) so that the first touch line (TL) may be connected with the first touch driver 181 via the pad (PAD). Accordingly, the first touch electrodes (TE) connected with each other in the first direction (Y-axis direction) may receive a driving pulse from the first touch driver 181 through the first touch line (TL).

The first touch line (TL) is overlapped with the auxiliary line (AL). The first touch line (TL) may be in contact with the first auxiliary line (AL1) via a second contact hole (CH2). The second contact hole (CH2) may penetrate through the insulating layer 310. The first touch line (TL) may be in contact with the first auxiliary line (AL1) via the second contact hole (CH2) disposed in the insulating layer 310 and configured to expose the first auxiliary line (AL1).

Although not shown in detail, the second metal pattern may be a second touch line (RL) which extends from the second touch electrode (RE) disposed at one end among the plurality of second touch electrodes (RE) connected with each other in the second direction (X-axis direction), and is also patterned in the pad area (PA). The second touch line (RL) is in contact with the pad (PAD) in the pad area (PA) so that the second touch line (RL) may be connected with the second touch driver 182 via the pad (PAD). Accordingly, the second touch driver 182 may receive the charge change amount in the touch sensors of the second touch electrodes (RE) connected with each other in the second direction (X-axis direction).

The second touch line (RL) is overlapped with the auxiliary line (AL). The second touch line (RL) may be in contact with the first auxiliary line (AL1) via the second contact hole (CH2). The second contact hole (CH2) may penetrate through the insulating layer 310. The second touch line (RL) may be in contact with the first auxiliary line (AL1) via the second contact hole (CH2) disposed in the insulating layer 310 and configured to expose the first auxiliary line (AL1).

The passivation film 320 is formed on the insulating film 310, the first touch electrodes (TE) and the second touch electrodes (RE). The passivation film 320 prevents the harmful environments so that it is possible to maintain the characteristic stabilization of the display device.

Third Embodiment

Figure 8:
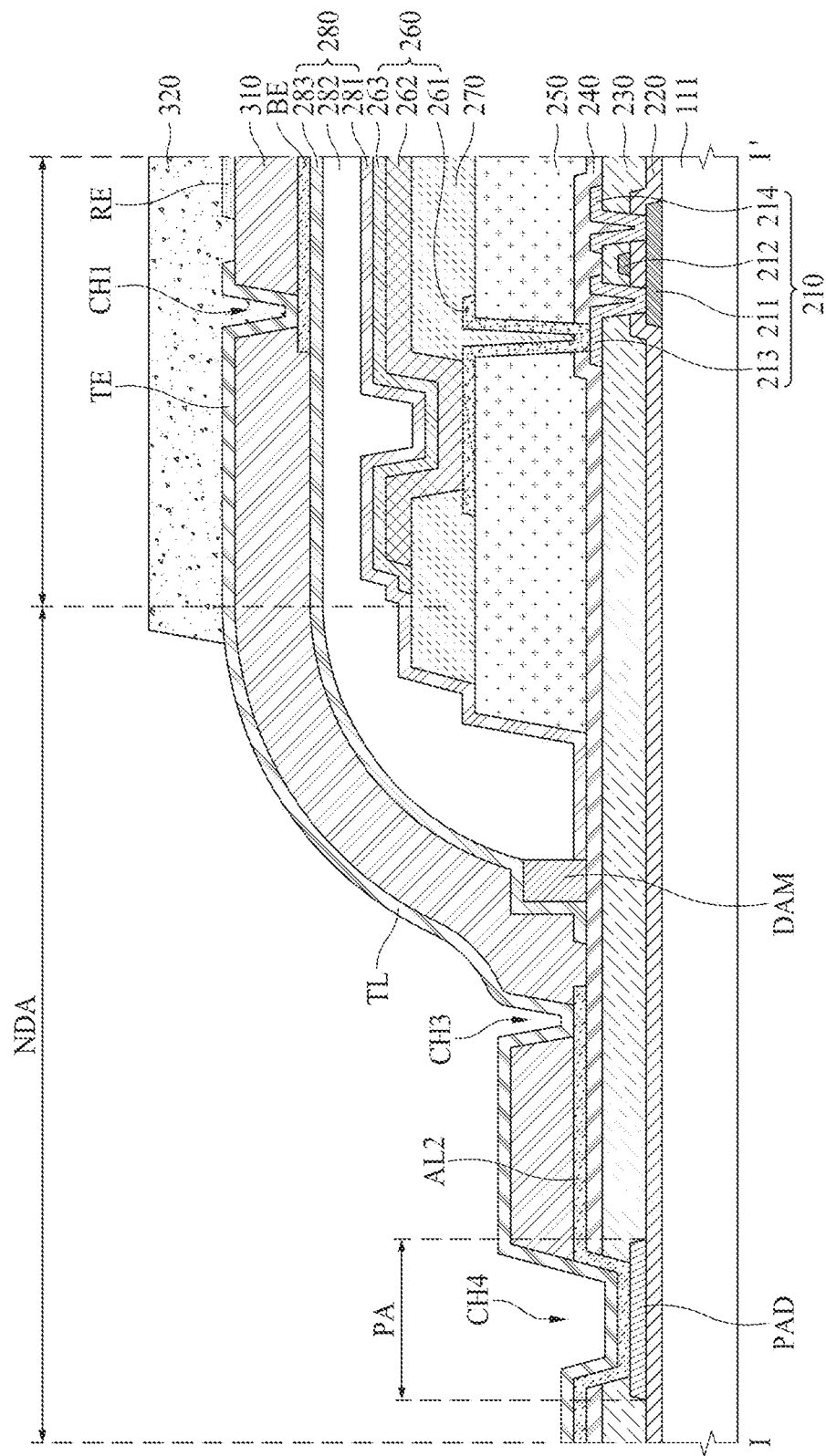
FIG. 8 is a cross sectional view illustrating a third embodiment along I-I' of FIG. 5.

FIG. 8 is a cross sectional view illustrating a third embodiment along I-I' of FIG. 5.

A display device shown in FIG. 8 is different in its auxiliary line (AL) including only second auxiliary line (AL2) from the display device shown in FIG. 6. Hereinafter, a detailed description for the same parts as those of FIG. 6 will be omitted.

Referring to FIG. 8, a first substrate 111 is divided into a display area (DA) and a non-display area (NDA), wherein a pad area (PA) for pads (PAD) and a dam (DAM) may be formed in the non-display area (NDA).

A thin film transistor layer 10 and an organic light emitting device layer 20 may be formed in the display area (DA) of the first substrate 11.

The thin film transistor layer 10 may include thin film transistors 210, a gate insulating film 220, an insulating interlayer 230, a protection layer 240, and a planarization film 250.

An organic light emitting device layer 20 is formed on the thin film transistor layer 10, wherein the organic light emitting device layer 20 includes organic light emitting devices 260 and bank 270.

An encapsulation layer 30 is formed on the organic light emitting device layer 20, wherein the encapsulation layer 30 is provided in the non-display area (NDA) as well as the display area (DA). The encapsulation layer 30 may include an encapsulation film 280 and a dam (DAM).

A touch sensing layer 40 is formed on the encapsulation layer 30. The touch sensing layer 40 may include first touch electrodes (TE), second touch electrodes (RE), bridge electrodes (BE), a first metal pattern, a second metal pattern, an insulating layer 310 and a passivation film 320.

A buffer layer is formed on the encapsulation layer 30. The buffer layer is formed to expose the pad (PAD) in the display area (DA) and the non-display area (NDA). The buffer layer is provided to cover the dam (DAM). It is possible to omit the buffer layer.

The bridge electrodes (BE) and the first metal pattern are formed on the buffer layer. The bridge electrodes (BE) are formed in the display area (DA) and are provided to electrically connect the first touch electrodes (TE), which are formed on the insulating layer 310, with each other. In order to prevent a disconnection between the first touch electrodes (TE) and the second touch electrodes (RE) at their intersections, the first touch electrodes (TE) which are adjacent to each other in a first direction (Y-axis direction) may be electrically connected by the use of bridge electrodes (BE). The bridge electrode (BE) may be disposed in the different layer from those of the first and second touch electrodes (TE, RE), and the bridge electrode (BE) may be connected with the adjacent first touch electrodes (TE) via first contact holes (CH1). The bridge electrode (BE) may intersect with the second touch electrode (RE).

The first metal pattern is formed in the non-display area (NDA), and is disposed in the same layer as those of the bridge electrodes (BE). The first metal pattern is provided at a predetermined interval from the bridge electrode (BE) disposed at one end among the plurality of bridge electrodes (BE). The first metal pattern is not provided in a dam area. Accordingly, as the dam area is provided with the dam (DAM), there is a step difference caused by the dam (DAM). For a process of manufacturing the first metal pattern, a remaining film may be generated due to the step difference caused by the dam (DAM). Accordingly, the metal patterns, which have to be electrically insulated from each other, may be connected with each other. In order to prevent this problem, the first metal pattern is not provided in the dam area of the display device according to the present disclosure.

The first metal pattern may be an auxiliary line (AL) which is connected with the first touch line (TL) or second touch line (RL) so as to reduce a resistance of the first touch line (RL) or second touch line (RL). The auxiliary line (AL) may include a second auxiliary line (AL2) provided between the dam area and the pad area (PA) and also patterned in the pad area (PA). As the second auxiliary line (AL2) is in contact with the pad (PAD) in the pad area (PA), the second auxiliary line (AL2) may be connected with a first touch driver 181 or second touch driver 182 via the pad (PAD).

In FIG. 8, the second auxiliary line (AL2) is patterned in the pad area (PA), but not limited to this structure. For example, the second auxiliary line (AL2) may be provided only between the dam area and the pad area (PA), and not patterned in the pad area (PA).

The insulating layer 310 is formed on the bridge electrodes (BE) and the first metal pattern. Accordingly, as the insulating layer 310 is disposed on the bridge electrodes (BE), it is possible to insulate the bridge electrodes (BE) from the second touch electrodes (RE). The insulating layer 310 is disposed between the bridge electrodes (BE) so that it is possible to insulate the bridge electrodes (BE) from each other.

The insulating layer 310 is formed in the non-display area (NDA) as well as the display area (DA). Especially, the insulating layer 310 is provided to cover the dam area so that it is possible to reduce the step difference caused by the dam (DAM). The insulating layer 310 has a thickness which is enough to prevent the remaining film caused by the step difference for a process of manufacturing the second metal pattern. The insulating layer 310 has a thickness which is greater than ½ (the half) of the height of the dam (DAM), preferably.

The first touch electrodes (TE), the second touch electrode (RE) and the second metal pattern are formed on the insulating layer 310. The first touch electrodes (TE) and the second touch electrodes (RE) are formed in the display area (DA). The first touch electrodes (TE) are disposed in a first direction (Y-axis direction), and are connected with each other. The second touch electrodes (RE) are disposed in a second direction (X-axis direction), and are connected with each other. The first direction (Y-axis direction) may be parallel to scan lines (S1~Sn) and the second direction (X-axis direction) may be parallel to data lines (D1~Dm), or the first direction (Y-axis direction) may be parallel to the data lines (D1~Dm) and the second direction (X-axis direction) may be parallel to the scan lines (S1~Sn).

Each of the first touch electrodes (TE) connected in the first direction (Y-axis direction) is electrically insulated from the first touch electrodes (TE) neighboring in the second direction (X-axis direction). Each of the second touch electrodes (RE) connected in the second direction (X-axis direction) is electrically insulated from the second touch electrodes (RE) neighboring in the first direction (Y-axis direction).

Accordingly, a mutual capacitance corresponding to a touch sensor may be formed in the intersection of the first and second touch electrodes (TE, RE).

The second metal pattern is formed in the non-display area (NDA), and is patterned to be overlapped with the first metal pattern.

The second metal pattern may be a first touch line (TL) which extends from the first touch electrode (TE) disposed at one end among the plurality of first touch electrodes (TE) connected with each other in the first direction (Y-axis direction), and is also patterned in the pad area (PA). The first touch line (TL) is in contact with the pad (PAD) in the pad area (PA) so that the first touch line (TL) may be connected with the first touch driver 181 via the pad (PAD). Accordingly, the first touch electrodes (TE) connected with each other in the first direction (Y-axis direction) may receive a driving pulse from the first touch driver 181 through the first touch line (TL).

The first touch line (TL) is overlapped with the auxiliary line (AL). The first touch line (TL) may be in contact with the second auxiliary line (AL2) via a third contact hole (CH3). The third contact hole (CH3) may penetrate through the insulating layer 310. The first touch line (TL) may be in contact with the second auxiliary line (AL2) via the third contact hole (CH3) disposed in the insulating layer 310 and configured to expose the second auxiliary line (AL2).

Although not shown in detail, the second metal pattern may be a second touch line (RL) which extends from the second touch electrode (RE) disposed at one end among the plurality of second touch electrodes (RE) connected with each other in the second direction (X-axis direction), and is also patterned in the pad area (PA). The second touch line (RL) is in contact with the pad (PAD) in the pad area (PA) so that the second touch line (RL) may be connected with the second touch driver 182 via the pad (PAD). Accordingly, the second touch driver 182 may receive the charge change amount in the touch sensors of the second touch electrodes (RE) connected with each other in the second direction (X-axis direction).

The second touch line (RL) is overlapped with the auxiliary line (AL). The second touch line (RL) may be in contact with the second auxiliary line (AL2) via the third contact hole (CH3). The third contact hole (CH3) may penetrate through the insulating layer 310. The second touch line (RL) may be in contact with the second auxiliary line (AL2) via the third contact hole (CH3) disposed in the insulating layer 310 and configured to expose the second auxiliary line (AL2).

The passivation film 320 is formed on the insulating film 310, the first touch electrodes (TE) and the second touch electrodes (RE). The passivation film 320 prevents the harmful environments so that it is possible to maintain the characteristic stabilization of the display device.

Fourth Embodiment

Figure 9:
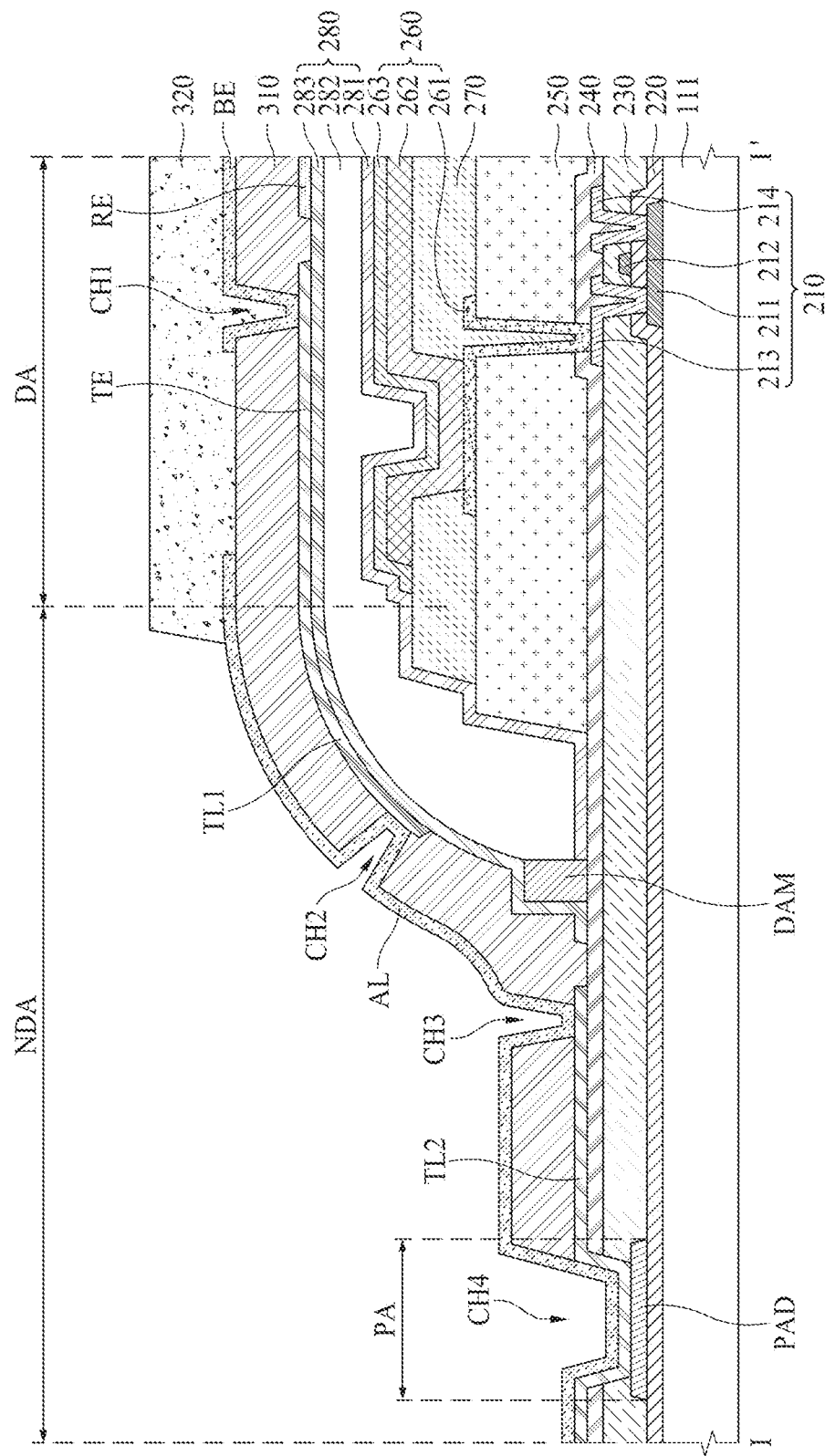
FIG. 9 is a cross sectional view illustrating a fourth embodiment along I-I' of FIG. 5.

FIG. 9 is a cross sectional view illustrating a fourth embodiment along I-I' of FIG. 5.

A display device shown in FIG. 9 is different in its bridge electrodes (BE) disposed on first and second touch electrodes (TE, RE) from the display device shown in FIG. 6. Hereinafter, a detailed description for the same parts as those of FIG. 6 will be omitted.

Referring to FIG. 9, a first substrate 111 is divided into a display area (DA) and a non-display area (NDA), wherein a pad area (PA) for pads (PAD) and a dam (DAM) may be formed in the non-display area (NDA).

A thin film transistor layer 10 and an organic light emitting device layer 20 may be formed in the display area (DA) of the first substrate 11.

The thin film transistor layer 10 may include thin film transistors 210, a gate insulating film 220, an insulating interlayer 230, a protection layer 240, and a planarization film 250.

An organic light emitting device layer 20 is formed on the thin film transistor layer 10, wherein the organic light emitting device layer 20 includes organic light emitting devices 260 and bank 270.

An encapsulation layer 30 is formed on the organic light emitting device layer 20, wherein the encapsulation layer 30 is provided in the non-display area (NDA) as well as the display area (DA). The encapsulation layer 30 may include an encapsulation film 280 and a dam (DAM).

A touch sensing layer 40 is formed on the encapsulation layer 30. The touch sensing layer 40 may include first touch electrodes (TE), second touch electrodes (RE), bridge electrodes (BE), a first metal pattern, a second metal pattern, an insulating layer 310 and a passivation film 320.

A buffer layer is formed on the encapsulation layer 30. The buffer layer is formed to expose the pad (PAD) in the display area (DA) and the non-display area (NDA). The buffer layer is provided to cover the dam (DAM). It is possible to omit the buffer layer.

The first touch electrodes (TE), the second touch electrodes (RE) and the first metal pattern are formed on the buffer layer.

The first touch electrodes (TE) and the second touch electrodes (RE) are formed in the display area (DA). The first touch electrodes (TE) are disposed in a first direction (Y-axis direction), and are connected with each other. The second touch electrodes (RE) are disposed in a second direction (X-axis direction), and are connected with each other. The first direction (Y-axis direction) may be parallel to scan lines (S1 Sn) and the second direction (X-axis direction) may be parallel to data lines (D1~Dm), or the first direction (Y-axis direction) may be parallel to the data lines (D1~Dm) and the second direction (X-axis direction) may be parallel to the scan lines (S1~Sn).

Each of the first touch electrodes (TE) connected in the first direction (Y-axis direction) is electrically insulated from the first touch electrodes (TE) neighboring in the second direction (X-axis direction). Each of the second touch electrodes (RE) connected in the second direction (X-axis direction) is electrically insulated from the second touch electrodes (RE) neighboring in the first direction (Y-axis direction).

Accordingly, a mutual capacitance corresponding to a touch sensor may be formed in the intersection of the first and second touch electrodes (TE, RE).

The first metal pattern is formed in the non-display area (NDA), and is disposed in the same layer as those of the first and second touch electrodes (TE, RE). The first metal pattern may extend from the first touch electrode (TE) or second touch electrode (RE), and may be patterned. The first metal pattern is not formed in the dam area. Accordingly, as the dam area is provided with the dam (DAM), there is a step difference caused by the dam (DAM). For a process of manufacturing the first metal pattern, a remaining film may be generated due to the step difference caused by the dam (DAM). Accordingly, the metal patterns, which have to be electrically insulated from each other, may be connected with each other. In order to prevent this problem, the first metal pattern is not provided in the dam area of the display device according to the present disclosure.

The first metal pattern may be a first touch line (TL) which transmits a driving pulse, which is provided to the pad (PAD) from the first touch driver 181, to the first touch electrode (TE). The first touch line (TL) may be formed by physically separating one of the first touch line (TL1) patterned between the display area (DA) and the dam area from another first touch line (TL2) patterned between the dam area and the pad area (PA). Herein, one of the first touch line (TL) extends from the first touch electrode (TE) disposed at one end among the plurality of first touch electrodes (TE) connected with each other in the first direction (Y-axis direction), and is then patterned between the display area (DA) and the dam area provided with the dam (DAM). Also, another the first touch line (TL2) is provided between the dam area and the pad area (PA), and further patterned in the pad area (PA). Another first touch line (TL2) is in contact with the pad (PAD) in the pad area (PA), whereby another first touch line (TL2) may be connected with the first touch driver 181 through the pad (PAD).

Although not shown in detail, the first metal pattern may be a second touch line (RL) which transmits the charge change amount of the touch sensors, which is provided to the pad (PAD) from the second touch driver 182, to the second touch electrode (RE). The second touch line (RL) may be formed by physically separating one of the second touch line (RL1) patterned between the display area (DA) and the dam area from another second touch line (RL2) patterned between the dam area and the pad area (PA). Herein, one of the second touch line (RL) extends from the second touch electrode (RE) disposed at one end among the plurality of second touch electrodes (RE) connected with each other in the second direction (X-axis direction), and is then patterned between the display area (DA) and the dam area provided with the dam (DAM). Also, another second touch line (RL2) is provided between the dam area and the pad area (PA), and further patterned in the pad area (PA). Another second touch line (RL2) is in contact with the pad (PAD) in the pad area (PA), whereby another second touch line (RL2) may be connected with the second touch driver 182 through the pad (PAD).

The insulating layer 310 is formed on the first touch electrodes (TE), the second touch electrodes (RE) and the first metal pattern. The first touch electrodes (TE), the second touch electrodes (RE) and the first metal pattern may be disposed in the same layer. The insulating layer 310 may be disposed on the first touch electrodes (TE) and the second touch electrodes (RE), and also disposed between the first touch electrodes (TE) and the second touch electrodes (RE). Each of the first touch electrodes (RE) may be insulated from each of the second touch electrodes (RE) by the use of insulating layer 310.

The insulating layer 310 is formed in the non-display area (NDA) as well as the display area (DA). Especially, the insulating layer 310 is provided to cover the dam area so that it is possible to reduce the step difference caused by the dam (DAM). The insulating layer 310 has a thickness which is enough to prevent the remaining film caused by the step difference for a process of manufacturing the second metal pattern. The insulating layer 310 has a thickness which is greater than ½ (the half) of the height of the dam (DAM), preferably.

The bridge electrodes (BE) and the second metal pattern are formed on the insulating layer 310. The bridge electrodes (BE) are formed in the display area (DA), and are provided to electrically connect the first touch electrodes (TE) with each other. In more detail, in order to prevent a disconnection between the first touch electrodes (TE) and the second touch electrodes (RE) at their intersections, the first touch electrodes (TE) which are adjacent to each other in a first direction (Y-axis direction) may be electrically connected by the use of bridge electrodes (BE). The bridge electrode (BE) may be disposed in the different layer from those of the first and second touch electrodes (TE, RE), and the bridge electrode (BE) may be connected with the adjacent first touch electrodes (TE) via first contact holes (CH1). The bridge electrode (BE) may intersect with the second touch electrode (RE).

In this case, the first contact holes (CH1) may penetrate through the insulating layer 310. As the bridge electrode (BE) is provided in the insulating layer 310, the bridge electrode (BE) is in contact with the two of adjacent first touch electrodes (TE) through the two of first contact holes (CH1), to thereby connect the two of first contact holes (CH1) with each other.

The second metal pattern is disposed in the non-display area (NDA), and is formed in the same layer as the bridge electrodes (BE). The second metal pattern is provided at a predetermined interval from the bridge electrode (BE) disposed at one side among the plurality of bridge electrodes (BE). The second metal pattern is overlapped with the first metal pattern. Unlike the first metal pattern, the second metal pattern may be formed in the dam area.

The second metal pattern may be an auxiliary line (AL) which connects the two of first touch lines (TL) physically separated from each other, and is in contact with the first touch line (TL) so as to reduce the resistance of the first touch line (TL). As shown in FIG. 9, the auxiliary line (AL) extends from a position provided at a predetermined interval from the bridge electrode (BE) disposed at one end among the plurality of bridge electrodes, and is then patterned in the pad area (PA), but not limited to this structure. In order to electrically connect the two of first touch lines (TL1, TL2) physically separated from each other, the auxiliary line (AL) is formed in the dam area, but not formed in the pad area (PA).

The auxiliary line (AL) is overlapped with the first touch line (TL). The auxiliary line (AL) may be in contact with one of the first touch line (TL1) via the second contact hole (CH2). The second contact hole (CH2) may penetrate through the insulating layer 310. The auxiliary line (AL) may be in contact with one of the first touch line (TL1) via the second contact hole (CH2) disposed in the insulating layer 310 and configured to expose one of the first touch line (TL1). Also, the auxiliary line (AL) may be in contact with another first touch line (TL2) via the third contact hole (CH3). The third contact hole (CH3) may penetrate through the insulating layer 310. The auxiliary line (AL) is in contact with another first touch line (TL2) via the third contact hole (CH3) for exposing another first touch line (TL2). Accordingly, the auxiliary line (AL) electrically connects one of the first touch line (TL1) with another first touch line (TL2).

Although not shown in detail, the second metal pattern may be an auxiliary line (AL) which connects the two of second touch lines (RL) physically separated from each other, and is in contact with the second touch line (RL) so as to reduce the resistance of the second touch line (RL). The auxiliary line (AL) extends from a position provided at a predetermined interval from the bridge electrode (BE) disposed at one end among the plurality of bridge electrodes, and is then patterned in the pad area (PA), but not limited to this structure. In order to electrically connect the two of second touch lines (RL1, RL2) physically separated from each other, the auxiliary line (AL) is formed in the dam area, but not formed in the pad area (PA).

The auxiliary line (AL) is overlapped with the second touch line (RL). The auxiliary line (AL) may be in contact with one of the second touch line (RL1) via the second contact hole (CH2). The second contact hole (CH2) may penetrate through the insulating layer 310. The auxiliary line (AL) may be in contact with one of the second touch line (RL1) via the second contact hole (CH2) disposed in the insulating layer 310 and configured to expose one of the second touch line (RL1). Also, the auxiliary line (AL) may be in contact with another second touch line (RL2) via the third contact hole (CH3). The third contact hole (CH3) may penetrate through the insulating layer 310. The auxiliary line (AL) is in contact with another second touch line (RL2) via the third contact hole (CH3) disposed in the insulating layer 310 and configured to expose another second touch line (RL2). Accordingly, the auxiliary line (AL) electrically connects one of the second touch line (RL1) with another second touch line (RL2).

The passivation film 320 is formed on the insulating film 310, the bridge electrodes (BE) and the second metal pattern. The passivation film 320 prevents the harmful environments so that it is possible to maintain the characteristic stabilization of the display device.

In the present disclosure, as described above, the insulating layer 310 for covering the dam area as well as the display area (DA) is formed at the enough thickness so that it is possible to mitigate the step difference caused by the dam (DAM). Accordingly, it is possible to prevent the remaining film for a process of forming the second metal pattern on the dam (DAM), for example, the first touch line (TL) or second touch line (RL).

In the present disclosure, the auxiliary line (AL) is overlapped with the first touch line (TL) or second touch line (RL), and the first touch line (RL) or second touch line (RL) is in contact with the auxiliary line (AL), to thereby reduce the resistance of first touch line (TL) or second touch line (RL).

In the present disclosure, the auxiliary line (AL) is disposed in the same layer as the bridge electrode (BE), and the auxiliary line (AL) is formed of the same material as that of the bridge electrode (BE). Accordingly, it is possible to form the auxiliary line (AL) without an additional process.

In the present disclosure, the first touch line (TL) or second touch line (RL) is not formed in the dam area, and is in contact with the auxiliary line (AL) via the second and third contact holes (CH2, CH3) so that it is possible to prevent the remaining film for the process of forming the first touch line (TL) or second touch line (RL).

Fifth Embodiment

Figure 10:
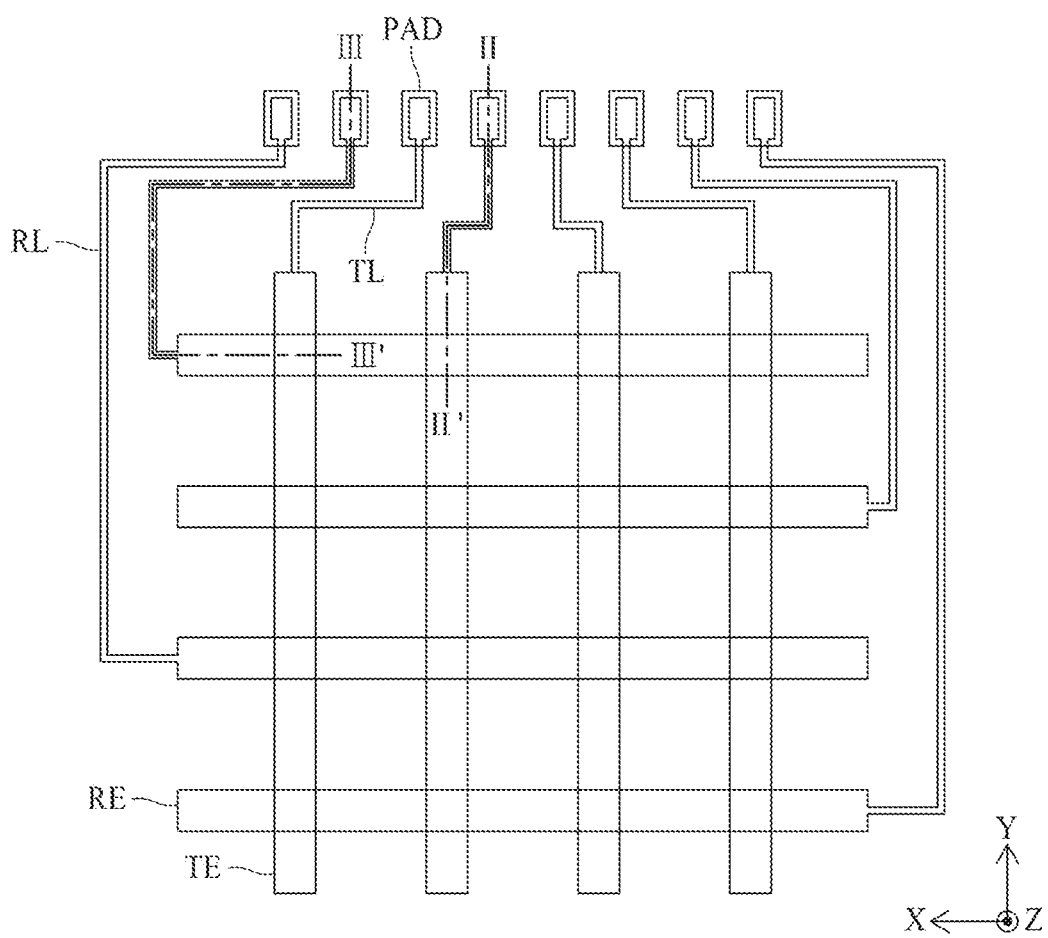
FIG. 10 is a plane view illustrating another embodiment of a touch sensing layer disposed in the first substrate shown in FIG. 4.
Figure 11:
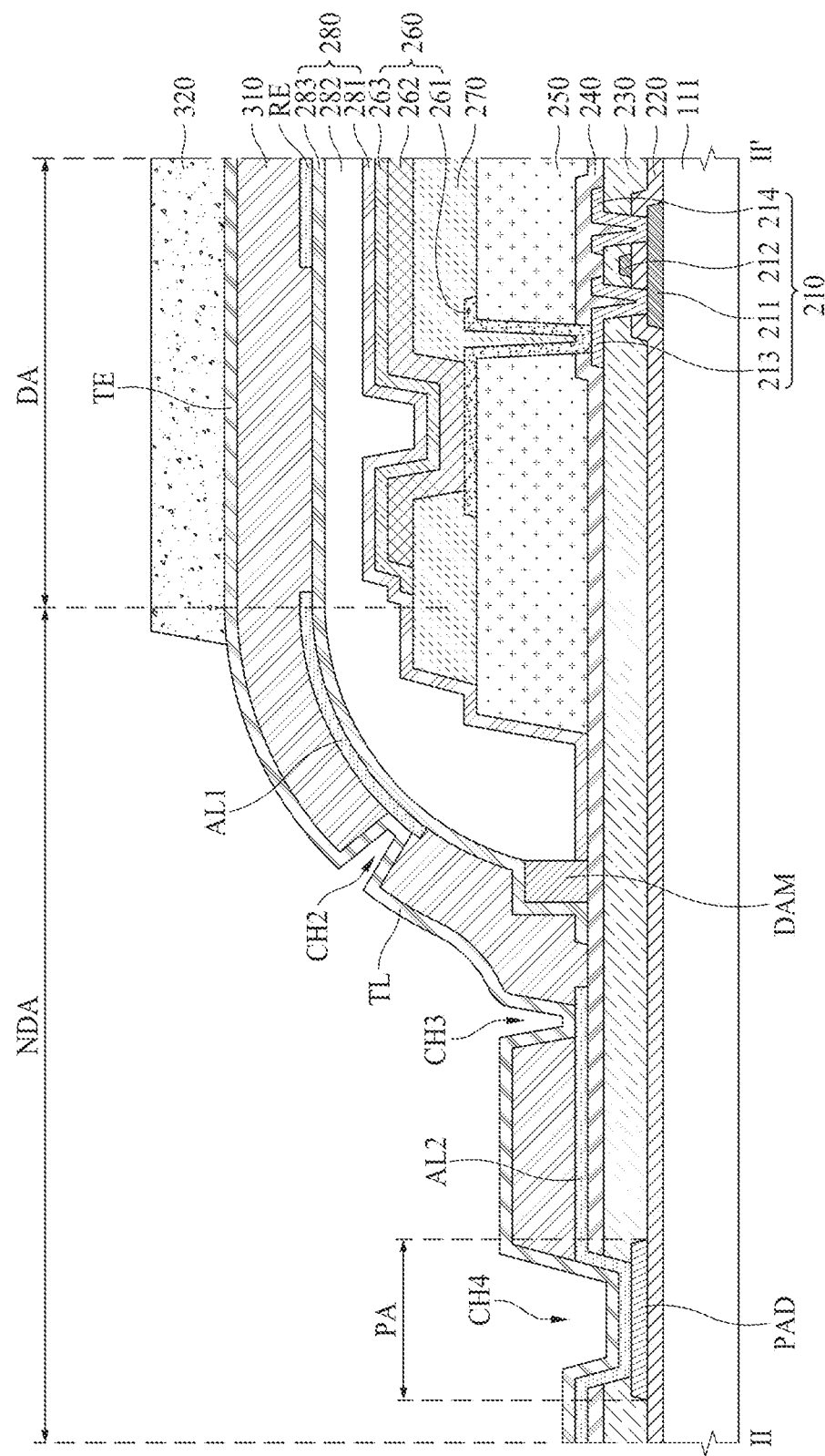
FIG. 11 is a cross sectional view illustrating one embodiment along II-II' of FIG. 10.
Figure 12:
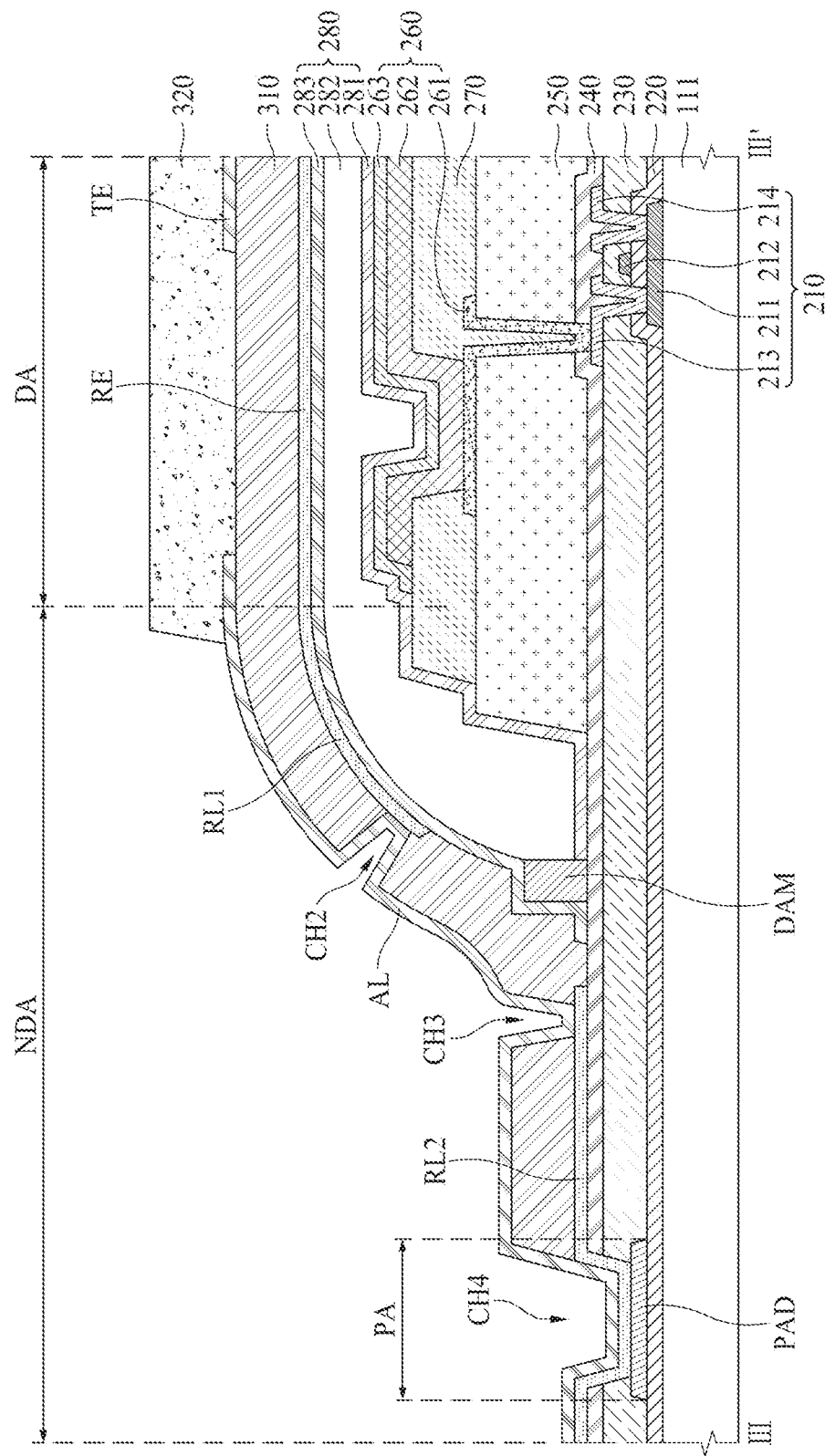
FIG. 12 is a cross sectional view illustrating one embodiment along III-III' of FIG. 10.

FIG. 10 is a plane view illustrating another embodiment of a touch sensing layer disposed in a first substrate shown in FIG. 4. FIG. 11 is a cross sectional view illustrating one embodiment along II-IF of FIG. 10. FIG. 12 is a cross sectional view illustrating one embodiment along of FIG. 10.

A display device shown in FIGS. 10 to 12 is different in its first and second touch electrodes (TE, RE) disposed at the different layers from the display device shown in FIGS. 5 and 6. Hereinafter, a detailed description for the same parts as those of FIGS. 5 and 6 will be omitted.

Referring to FIGS. 10 to 12, a first substrate 111 is divided into a display area (DA) and a non-display area (NDA), wherein a pad area (PA) for pads (PAD) and a dam (DAM) may be formed in the non-display area (NDA).

A thin film transistor layer 10 and an organic light emitting device layer 20 may be formed in the display area (DA) of the first substrate 11.

The thin film transistor layer 10 may include thin film transistors 210, a gate insulating film 220, an insulating interlayer 230, a protection layer 240, and a planarization film 250.

An organic light emitting device layer 20 is formed on the thin film transistor layer 10, wherein the organic light emitting device layer 20 includes organic light emitting devices 260 and bank 270.

An encapsulation layer 30 is formed on the organic light emitting device layer 20, wherein the encapsulation layer 30 is provided in the non-display area (NDA) as well as the display area (DA). The encapsulation layer 30 may include an encapsulation film 280 and a dam (DAM).

A touch sensing layer 40 is formed on the encapsulation layer 30. The touch sensing layer 40 may include first touch electrodes (TE), second touch electrodes (RE), bridge electrodes (BE), a first metal pattern, a second metal pattern, an insulating layer 310 and a passivation film 320.

A buffer layer is formed on the encapsulation layer 30. The buffer layer is formed to expose the pad (PAD) in the display area (DA) and the non-display area (NDA). The buffer layer is provided to cover the dam (DAM). It is possible to omit the buffer layer.

The first touch electrodes (TE), the second touch electrodes (RE) and the first metal pattern are disposed on the buffer layer, and the first touch electrodes (TE) and the second touch electrodes (RE) are formed in the display area (DA). The first touch electrodes (TE) extend in a first direction (X-axis direction), to thereby form a line shape. The second touch electrodes (RE) extend in a second direction (Y-axis direction), to thereby form a line shape. The first direction (X-axis direction) may be parallel to scan lines (S1~Sn) and the second direction (Y-axis direction) may be parallel to data lines (D1~Dm), or the first direction (X-axis direction) may be parallel to the data lines (D1~Dm) and the second direction (Y-axis direction) may be parallel to the scan lines (S1~Sn).

The insulating layer 310 is disposed between the first touch electrodes (TE) and the second touch electrodes (RE) so that the first touch electrodes (TE) are electrically insulated from the second touch electrodes (RE). Each of the first touch electrodes (TE) extending in the first direction is electrically insulated from the first touch electrodes (TE) neighboring in the second direction. Each of the second touch electrodes (RE) extending in the second direction is electrically insulated from the second touch electrodes (RE) neighboring in the first direction.

Accordingly, a mutual capacitance corresponding to a touch sensor may be formed in the intersection of the first and second touch electrodes (TE, RE).

Meanwhile, the insulating layer 310 is formed in the non-display area (NDA) as well as the display area (DA). Especially, the insulating layer 310 is provided to cover the dam area so that it is possible to reduce the step difference caused by the dam (DAM). The insulating layer 310 has a thickness which is enough to prevent the remaining film caused by the step difference for a process of manufacturing the second metal pattern. The insulating layer 310 has a thickness which is greater than ½ (the half) of the height of the dam (DAM), preferably.

The first metal pattern is formed in the non-display area (NDA), and is disposed in the same layer as the second touch electrode (RE). The first metal pattern is not formed in a dam area. Accordingly, as the dam area is provided with the dam (DAM), there is a step difference caused by the dam (DAM). For a process of manufacturing the first metal pattern, a remaining film may be generated due to the step difference caused by the dam (DAM). Accordingly, the metal patterns, which have to be electrically insulated from each other, may be connected with each other. In order to prevent this problem, the first metal pattern is not provided in the dam area of the display device according to the present disclosure.

The first metal pattern may be an auxiliary line (AL) which is provided at a predetermined interval from the second touch electrode (RE) disposed at one end of the first direction among the plurality of second touch electrodes (RE). The auxiliary line (AL) may include a first auxiliary line (AL1) provided between the display area (DA) and the dam area provided with the dam (DAM). Also, the auxiliary line (AL) may include a second auxiliary line (AL2) provided between the dam area and the pad area (PA) and also patterned in the pad area (PA). As the second auxiliary line (AL2) is in contact with the pad (PAD) in the pad area (PA), the second auxiliary line (AL2) may be connected with a first touch driver 181 via the pad (PAD). Meanwhile, the first auxiliary line (AL1) and the second auxiliary line (AL2) are provided with the dam area interposed in-between, whereby the first auxiliary line (AL1) is physically separated from the second auxiliary line (AL2). In the drawings, there are both the first auxiliary line (AL1) and the second auxiliary line (AL2), but not limited to this structure. According to another embodiment of the present disclosure, the auxiliary line (AL) may include any one of the first and second auxiliary lines (AL1, AL2). The auxiliary line (AL) is in contact with the first touch line (TL), to thereby reduce the resistance of the first touch line (TL).

Also, the first metal pattern may be a second touch line (RL) extending from the second touch electrode (RE) disposed at one end of the second direction among the plurality of second touch electrodes (RE). The second touch line (RL) may be formed by physically separating one of the second touch line (RL1) patterned between the display area (DA) and the dam area from another second touch line (RL2) patterned between the dam area and the pad area (PA). Herein, one of the second touch line (RL1) extends from the second touch electrode (RE) disposed at one end of the second direction among the plurality of second touch electrodes (RE) connected with each other, and is then patterned between the display area (DA) and the dam area provided with the dam (DAM). Also, another second touch line (RL2) is provided between the dam area and the pad area (PA), and further patterned in the pad area (PA). Another second touch line (RL2) is in contact with the pad (PAD) in the pad area (PA), whereby another second touch line (RL2) may be connected with the second touch driver 182 through the pad (PAD).

The second metal pattern is disposed in the non-display area (NDA), and is formed in the same layer as the first touch electrodes (TE). The second metal pattern is patterned while being overlapped with the first metal pattern. Unlike the first metal pattern, the second metal pattern may be formed in the dam area.

The second metal pattern may be a first touch line (TL) which extends from the first touch electrode (TE) disposed at one end of the first direction among the plurality of first touch electrodes (TE), and is patterned in the pad area (PA). The first touch line (TL) is in contact with the pad (PAD) in the pad area (PA), and is connected with the first touch driver 181 through the pad (PAD). Thus, the first touch electrodes (TE) connected with each other in the first direction (Y-axis direction) may receive a driving pulse from the first touch driver 181 through the first touch line (TL).

The first touch line (TL) is overlapped with the first auxiliary line (AL1) and the second auxiliary line (AL2) formed in the same layer as the second touch electrodes (RE). The first touch line (TL) may be in contact with the first auxiliary line (AL1) via a second contact hole (CH2). The second contact hole (CH2) may penetrate through the insulating layer 310. The first touch line (TL) is in contact with the first auxiliary line (AL1) via the second contact hole (CH2) disposed in the insulating layer 310 and configured to expose the first auxiliary line (AL1). Also, the first touch line (TL) may be in contact with the second auxiliary line (AL2) via a third contact hole (CH3). The third contact hole (CH3) may penetrate through the insulating layer 310. The first touch line (TL) may be in contact with the second auxiliary line (AL2) via the third contact hole (CH3) disposed in the insulating layer 310 and configured to expose the second auxiliary line (AL2).

Also, the second metal pattern may be an auxiliary line (AL) which is provided at a predetermined interval from the first touch electrode (TE) disposed at one end of the second direction among the plurality of first touch electrodes (TE). The auxiliary line (AL) may extend from a position spaced from the first touch electrode (TE), and may be patterned in the pad area (PA), but not limited to this structure. In order to electrically connect the two of second touch lines (RL1, RL2), which are physically separated from each other, with each other, the auxiliary line (AL) is formed in the dam area, but not formed in the pad area (PA). The auxiliary line (AL) is capable of connecting the physically-separated two of second touch lines (RL) with each other, and also capable of being in contact with the second touch line (RL), to thereby reduce the resistance of the second touch line (RL).

The auxiliary line (AL), which is formed in the same layer as the first touch electrodes (TE), is overlapped with the second touch line (RL). The auxiliary line (AL) may be in contact with one of the second touch line (RL) via the second contact hole (CH2). The second contact hole (CH2) may penetrate through the insulating layer 310. The auxiliary line (AL) may be in contact with one of the second touch line (RL1) via the second contact hole (CH2) disposed in the insulating layer 310 and configured to expose one of the second touch line (RL1). Also, the auxiliary line (AL) may be in contact with another second touch line (RL2) via the third contact hole (CH3). The third contact hole (CH3) may penetrate through the insulating layer 310. The auxiliary line (AL) is in contact with another second touch line (RL2) via the third contact hole (CH3) disposed in the insulating layer 310 and configured to expose another second touch line (RL2). Accordingly, the auxiliary line (AL) electrically connects one of the second touch line (RL1) with another second touch line (RL2).

The passivation film 320 is formed on the insulating layer 310 and the first touch electrode (TE). The passivation film 320 prevents the harmful environments so that it is possible to maintain the characteristic stabilization of the display device.

Figure 13:
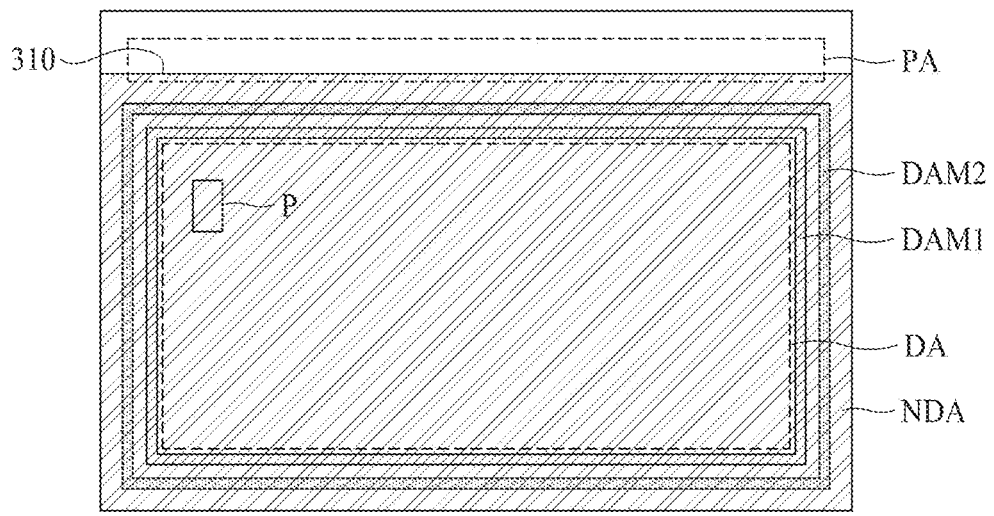
FIG. 13 is a plane view illustrating a first substrate according to another embodiment of the present disclosure.
Figure 14:
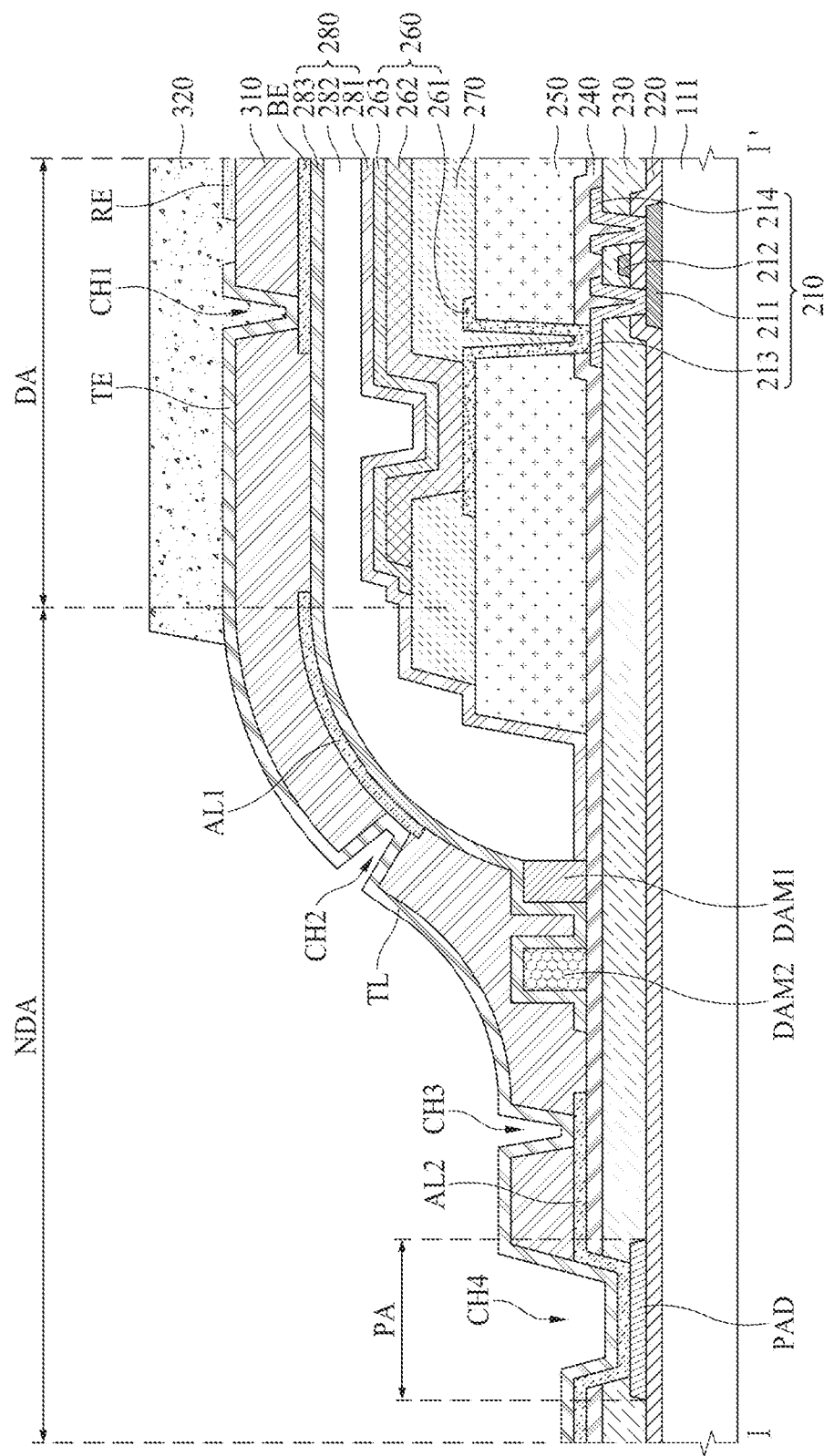
FIG. 14 is a cross sectional view illustrating another embodiment along I-I' of FIG. 5.

In the first to fifth embodiments of the present disclosure, there is one dam (DAM), but not limited to this structure. FIG. 13 is a plane view illustrating a first substrate according to another embodiment of the present disclosure; and FIG. 14 is a cross sectional view illustrating another embodiment along I-I' of FIG. 5. As shown in FIG. 13 and FIG. 14, the plurality of dams (DAM) may be applied to the structure for each of the first to fifth embodiments of the present disclosure.

In more detail, a first substrate 111 may include a display area (DA) and a non-display area (NDA), wherein a pad area (PA) for pads (PAD), a first dam (DAM1) and a second dam (DAM2) may be formed in the non-display area (NDA).

The first dam (DAM1) and the second dam (DAM2) are disposed in the non-display area (NDA), to thereby prevent a flow of an organic film 282 for an encapsulation film 280. In more detail, the first dam (DAM1) is disposed to surround the periphery of the display area (DA), whereby the flow of the organic film 282 for the encapsulation film 280 may be firstly blocked. Also, the first dam (DAM1) is disposed between the display area (DA) and the pad area (PA) so that it is possible to firstly block the flow of the organic film 282, that is, to prevent the organic film 282 for the encapsulation film 280 from flowing out into the pad area (PA).

Also, the second dam (DAM2) is provided to surround the periphery of the first dam (DAM1), whereby the organic film 282, which might flow out into the periphery of the first dam (DAM1), may be secondly blocked. Thus, the first dam (DAM1) and the second dam (DAM2) may prevent the organic film 282 from being exposed to the external of the display device, or from flowing out into the pad area (PA).

The first dam (DAM1) and the second dam (DAM2) may be manufactured together with a planarization film 250 of a pixel (P) or a bank 270. Also, the first dam (DAM1) and the second dam (DAM2) may be formed of the same material as that of the planarization film 250 or the bank 270. For example, the dam (DAM) may be formed of an organic material, for example, acryl resin, epoxy resin, phenolic resin, polyamide resin, polyimide resin, and etc.

A first metal pattern is formed in the non-display area (NDA), and the first metal pattern is not formed in a dam area provided with the first dam (DAM1) and the second dam (DAM2).

An insulating layer 310 may be formed on the first metal pattern. The insulating layer 310 is formed in the non-display area (NDA) as well as the display area (DA). Especially, the insulating layer 310 is formed to cover the dam area so that it is possible to mitigate a step difference caused by the first dam (DAM1) and the second dam (DAM2). The insulating layer 310 has a thickness enough to fill a gap space generated by spacing the first dam (DAM1) and the second dam (DAM2) from each other.

A second metal pattern may be formed on the insulating layer 310. The second metal pattern is formed in the non-display area (NDA). Unlike the first metal pattern, the second metal pattern may be formed in the dam area provided with the first dam (DAM1) and the second dam (DAM2). The second metal pattern may be in contact with the first metal pattern via a contact hole penetrating through the insulating layer 310.

According to the embodiment of the present disclosure, the touch sensing layer is directly formed on the encapsulation layer, whereby it is unnecessary to carry out the alignment process between the first substrate and the second substrate for the process of bonding the first substrate and the second substrate to each other.

Also, the first metal pattern is not formed in the dam area so that it is possible to prevent the remaining film for the process of forming the first metal pattern.

Also the insulating layer for covering the dam area as well as the display area (DA) is formed at the enough thickness so that it is possible to mitigate the step difference caused by the dam (DAM). Accordingly, it is possible to prevent the remaining film for the process of forming the second metal pattern on the dam (DAM), for example, the first touch line (TL) or second touch line (RL).

Also, the auxiliary line (AL) is overlapped with the first touch line (TL) or second touch line (RL), and the first touch line (RL) or second touch line (RL) is in contact with the auxiliary line (AL), to thereby reduce the resistance of first touch line (TL) or second touch line (RL).

Also, the auxiliary line (AL) is disposed in the same layer as the bridge electrode (BE), the first touch electrode or the second touch electrode, and the auxiliary line (AL) is formed of the same material as that of the bridge electrode (BE), the first touch electrode or the second touch electrode. Accordingly, it is possible to form the auxiliary line (AL) without an additional process.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
a substrate including a display area provided with pixels, and a non-display area adjacent to the display area and including at least one pad;
a dam structure disposed between the display area and the pad;
an encapsulation film covering the pixels disposed in the display area, the encapsulation film including at least one inorganic film covering the dam structure;
a first metal pattern having at least a portion disposed in the non-display area and positioned on the encapsulation film;
an insulating layer provided on the first metal pattern and the dam structure; and
a second metal pattern disposed on the insulating layer and overlapping the dam structure, the second metal pattern being in contact with the first metal pattern via a contact hole penetrating through the insulating layer.

2. The display device according to claim 1, wherein the dam structure is disposed to surround the display area.

3. The display device according to claim 1, wherein the contact hole overlaps the dam structure.

4. The display device according to claim 1, wherein a plurality of dam structures are provided, the plurality of dam structures have different heights.

5. The display device according to claim 1, wherein a plurality of contact holes are provided, the plurality of contact holes have different heights.

6. The display device according to claim 1, wherein at least one of the first and second metal patterns is in contact with the pad.

7. The display device according to claim 1, further comprising:
first touch electrodes provided on the encapsulation film of the display area, the first touch electrodes connected to one another in a first direction; and
second touch electrodes provided on the encapsulation film of the display area, the second touch electrodes connected to one another in a second direction different from the first direction.

8. The display device according to claim 7, wherein the first touch electrodes are formed directly on a same layer as the second touch electrodes.

9. The display device according to claim 7, wherein the first touch electrodes are formed in the different layer from the second touch electrodes.

10. The display device according to claim 7, wherein the second metal pattern is a touch line formed in a same layer as the first touch electrodes, and extends from a connected first touch electrode to the pad, connecting the connected first touch electrode with the pad.

11. The display device according to claim 7, wherein the first metal pattern is an auxiliary line formed in the same layer as the second touch electrodes, and is spaced apart from the second touch electrodes.

12. The display device according to claim 1, wherein:
the first metal pattern is provided between the display area and the dam structure; and
the second metal pattern is in contact with the first metal pattern via a first contact hole disposed between the display area and the dam structure.

13. The display device according to claim 1, wherein:
the first metal pattern is provided between the dam structure and the pad; and
the second metal pattern is in contact with the first metal pattern via a second contact hole disposed between the dam structure and the pad.

14. The display device according to claim 7, wherein:
the first touch electrodes are formed in the same layer as the second touch electrodes;
the first touch electrodes are spaced from one another in the first direction; and
the second touch electrodes are integrated with one another in the second direction.

15. The display device according to claim 14, wherein the second metal pattern is a touch line formed in the same layer as the first and second touch electrodes, and one of extending from a first touch electrode disposed at one end among the plurality of first touch electrodes to the pad and electrically connecting the pad, or extending from a second touch electrode disposed at one end among the plurality of second touch electrodes to the pad and electrically connecting the pad.

16. The display device according to claim 14 further comprising a bridge electrode that electrically connects two adjacent first touch electrodes with each other in the first direction.

17. The display device according to claim 16, wherein:
the first metal pattern is provided between the display area and the dam structure and
the second metal pattern is in contact with the first metal pattern via a first contact hole disposed between the display area and the dam structure.

18. The display device according to claim 16, wherein:
the first metal pattern is provided between the dam structure and the pad; and
the second metal pattern is in contact with the first metal pattern via a second contact hole disposed between the dam structure and the pad.

19. The display device according to claim 16, wherein the first metal pattern is an auxiliary line formed in a same layer as the bridge electrode, and spaced apart from the bridge electrode.

20. The display device of claim 1, wherein the first metal pattern and second metal pattern stack over one another on the pad.

21. The display device of claim 1, wherein:
the encapsulation film includes a first inorganic film, an organic film over the first inorganic film, and a second inorganic film over the organic film;
a first sidewall of the dam structure is adjacent to the organic film; and
the second inorganic film extends over an upper surface of the dam structure and adjacent to a second sidewall of the dam structure, the second sidewall being opposite to the first sidewall.

22. The display device of claim 21, wherein the dam structure abuts the first inorganic film and a lower surface of the dam structure is substantially coplanar with an adjacent portion of the first inorganic film.

* * * * *